United States Patent
Lee et al.

(10) Patent No.: US 11,482,262 B1
(45) Date of Patent: Oct. 25, 2022

(54) PER PIN VREF FOR DATA RECEIVERS IN NON-VOLATILE MEMORY SYSTEM

(71) Applicant: SanDisk Technologies LLC, Addison, TX (US)

(72) Inventors: Jang Woo Lee, Seongnam-si (KR); Srinivas Rajendra, Milpitas, CA (US); Anil Pai, San Jose, CA (US); Venkatesh Ramachandra, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/348,904

(22) Filed: Jun. 16, 2021

(51) Int. Cl.
*G06F 13/16* (2006.01)
*G11C 7/10* (2006.01)
*G06F 13/40* (2006.01)

(52) U.S. Cl.
CPC ........ *G11C 7/1048* (2013.01); *G06F 13/1668* (2013.01); *G06F 13/4086* (2013.01); *G11C 2207/2254* (2013.01)

(58) Field of Classification Search
None
See application file for complete search history.

(56) References Cited

U.S. PATENT DOCUMENTS

| | | | |
|---|---|---|---|
| 8,923,065 B2 | 12/2014 | Ramachandra | |
| 9,214,199 B2 | 12/2015 | Brandl et al. | |
| 2010/0188918 A1 | 7/2010 | Fox et al. | |
| 2010/0213919 A1* | 8/2010 | Takayanagi | G06F 1/3203 323/318 |
| 2011/0188289 A1* | 8/2011 | Chevallier | G11C 13/003 365/210.1 |
| 2019/0066777 A1* | 2/2019 | Nguyen | H03K 3/012 |
| 2021/0065807 A1 | 3/2021 | Tang et al. | |
| 2021/0312958 A1* | 10/2021 | Stave | G11C 7/1078 |

OTHER PUBLICATIONS

Micron Technology, Inc., "TN-40-40: DDR4 Point-to-Point Design Guide," Technical Note, Aug. 2020, 34 pages.

* cited by examiner

*Primary Examiner* — Michael Sun
(74) *Attorney, Agent, or Firm* — Vierra Magen Marcus LLP

(57) ABSTRACT

Technology is disclosed herein for per pin internal reference voltage generation for data receivers in non-volatile memory systems. A receiving circuit may have an on-die voltage generator that has inputs to receive a separate voltage magnitude select signal for each data receiver on the receiving circuit. The on-die voltage generator provides a separate reference voltage for each data receiver. This allows the reference voltage for each data receiver to be calibrated separately. A separate reference voltage for each data receiver compensates for variations between data paths, and provides for a wider data valid window than if the same reference voltage were used for all data receivers. Generating the different reference voltages on-die can potentially require a large area, as well as consume considerable power and/or current. A voltage divider and multiplexers may provide the different reference voltages, which saves space and is power and current efficient.

20 Claims, 15 Drawing Sheets

PER PIN VREF FOR DATA RECEIVERS IN NON-VOLATILE MEMORY SYSTEM

BACKGROUND

In source synchronous systems, a transmitting device sends both data signals carrying data and a clock signal to a receiving device. The clock signal is sometimes referred to as a data strobe signal. The receiving device uses the clock signal to identify data values of the data carried by the data signals. In particular, the receiving device identifies levels of data pulses in response to detecting transitions of the clock signal. A write training process may be used to calibrate a delay between the clock signal and the data signals, which helps to provide a wider data valid window.

The receiving device has a number of data receivers. Each data receiver has an input connected to one of the data lines in order to receive a data signal from the transmitting device. In some techniques, each data receiver has a second input to receive a reference voltage. The data receiver compares the reference voltage with the data signal, and outputs a high voltage or a low voltage depending on the result of the comparison.

There are a number of elements along the data path associated with each data line. It is possible to have significant variation between the elements on the different data paths. For example, the transmitting device has an output driver for each of the data lines, the data lines are some form of conductive lines between the transmitting device and receiving device, and the receiving device has on-die termination (ODT) connected to each data line. There may be significant variation between output drivers, conductive lines, and ODT from one data path to the next. There can also be variation from one data path to the next along the internal data path of the receiving deice. Such variations from one data path to the next present challenges in properly identifying the data in the data signals. For example, data path variations make it difficult to achieve a wide data valid window. The ever increasing communication bus speeds mean that data path variations have a greater impact on achieving a wide data valid window.

BRIEF DESCRIPTION OF THE DRAWINGS

Like-numbered elements refer to common components in the different Figures.

DETAILED DESCRIPTION

Technology is disclosed herein for per pin internal reference voltage generation for data receivers in non-volatile memory systems. One embodiment includes a memory system having an on-die voltage generator that has inputs to receive a separate voltage magnitude select signal for each data receiver. The on-die voltage generator provides a separate reference voltage for each data receiver. This allows the reference voltage for each data receiver to be calibrated separately. A separate reference voltage for each data receiver compensates for variations between data paths, and provides for a wider data valid window than if the same reference voltage were used for all data receivers.

Also, by providing a wider data valid window, some of the constraints on the data receivers may be relaxed. One option for improving the performance of the data receivers is to increase the current consumption of the data receiver, which can improve the duty cycle at the output of the data receiver. Providing a wider data valid window allows the requirements on the duty cycle to be relaxed, which allows current consumption of the data receivers to be reduced.

However, the circuitry to generate the different reference voltages on-die can potentially require a large area, as well as consume considerable power and/or current. An embodiment of the on-die voltage generator has a voltage divider and multiplexers that provide the different reference voltages, which saves space and is power and current efficient.

Figure 1:
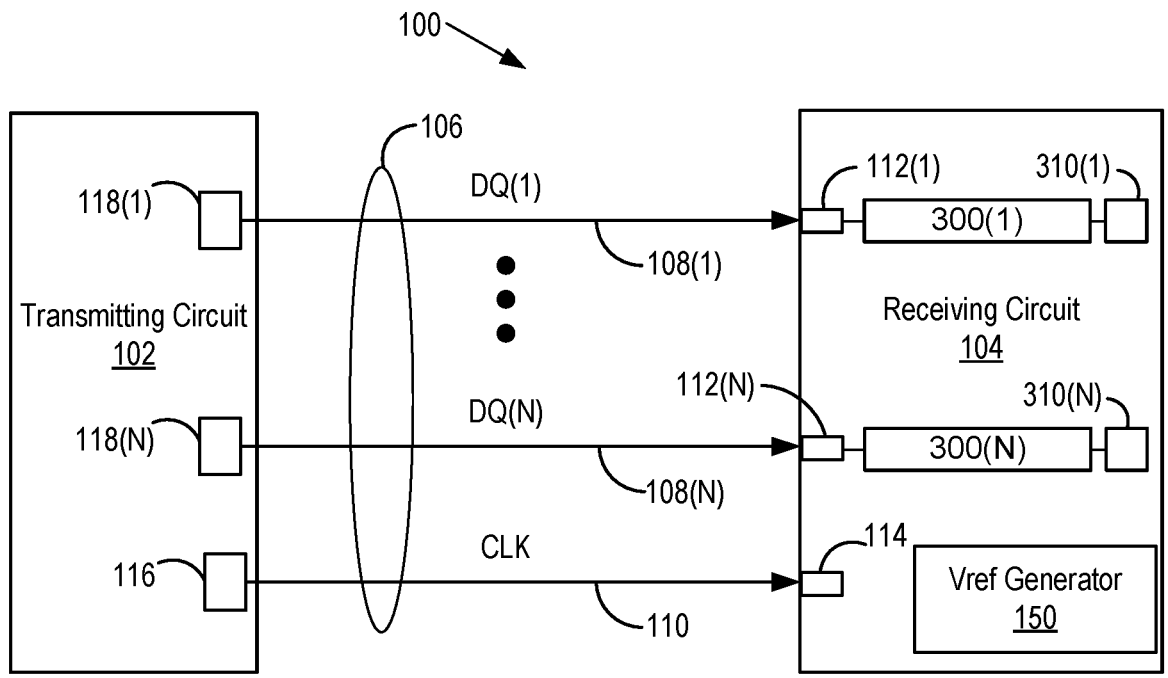
FIG. 1 is a block diagram of an example system that includes a transmitting circuit and a receiving circuit.

FIG. 1 shows one embodiment of a memory system 100 in which a reference voltage generator may be implemented. The memory system 100 includes a transmitting circuit 102 and a receiving circuit 104 configured to communicate with each other via a communications bus 106. Both the transmitting circuit 102 and the receiver circuit 104 may be transceiver circuits, which can be configured to transmit and receive signals. For simplicity, with reference to FIG. 1, one of the circuits 102 is designated as the transmitting circuit 102 and the other circuit 104 is designated as the receiving circuit 104.

Additionally, in particular example configurations, each of the transmitting circuit 102 and the receiving circuit 104 are integrated circuits (IC). In general, an integrated circuit (IC)—also referred to as a monolithic IC, a chip, or a microchip—is an assembly or a collection of electric circuit components (including active components, such as transistors and diodes, and passive components, such as capacitors and resistors) and their interconnections formed as a single unit, such as by being fabricated, on a substrate typically made of a semiconductor material such as silicon. For such embodiments, the transmitting circuit 102 and the receiving circuit 104 are separate integrated circuits, and the communication bus 106 is configured to communicate signals external to the separate transmitting circuit (IC) 102 and the receiving circuit (IC) 104. In some embodiments, the receiving circuit 104 contains a memory structure having non-volatile memory cells, and the transmitting circuit contains a memory controller.

The transmitting circuit 102 is configured to send a clock signal CLK and a plurality of data signals DQ to the receiving circuit 104 via a communications bus 106. Otherwise stated, the receiving circuit 104 is configured to receive a clock signal CLK and a plurality data signals DQ from the transmitting circuit 102 via the communications bus 106. The plurality of data signals DQ are shown in FIG. 1 as including data signals DQ(1) to DQ(N), where N is two or more. As an example, N is 8, although other integer numbers of two or more may be possible for other configurations. The clock signal may also be referred to herein as a data strobe signal.

From the perspective of the transmitting circuit 102, the clock signal CLK is an output clock signal, and the data signals DQ are output data signals in that they are the clock and data signals that the transmitting circuit 102 outputs to the receiving circuit 104. From the perspective of the receiving circuit 104, the clock signal CLK is an input clock signal, and the data signals DQ are input data signals in that they are the clock and data signals that the receiving circuit 104 receives from the transmitting circuit 102.

The communications bus 106 includes data lines 108(1) to 108(N) between the transmitting circuit 102 and the receiving circuit 104. The transmitting circuit 102 has data drivers 118(1)-118(N), each of which is configured to drive a data signal on one of the data lines 108. The receiving circuit has data contacts 112(1) to 112(N), which are in physical and electrical contact with the respective data lines 108(1) to 108(N). The data contacts 112(1) to 112(N) could be pins, pads, etc. The transmitting circuit 102 is configured to send the data signals DQ(1) to DQ(N) simultaneously and/or in parallel over the data lines 108(1) to 108(N) to the receiving circuit 104. Otherwise stated, the receiving circuit 104 is configured to receive the data signals DQ(1) to DQ(N) simultaneously and/or in parallel from over the data lines 108(1) to 108(N).

In addition, the communications bus 106 includes one or more clock lines 110 between the transmitting circuit 102 and the receiving circuit 104. The transmitting circuit 102 has a clock driver 116, which is configured to drive the clock signal on the clock line 110. The receiving circuit has one or more clock input contacts 114, which is/are in physical and electrical contact with the respective one or more clock lines 110. The clock input contact(s) could be pins, pads, etc. The input clock signal CLK may include a single-ended clock signal or a pair of complementary clock signals (e.g., CLK and CLKB). Where the input clock signal CLK is a single-ended clock signal, the one or more clock lines 110 may include a single clock line. Where the input clock signal CLK is a pair of complementary clock signals CLK, CLKB, the one or more clock lines 110 may include two clock lines. The transmitting circuit 102 may be configured to transmit each clock signal CLK, CLKB of the complementary pair over a respective one of the two clock lines 110. The receiving circuit 104 is configured to receive the input clock signal CLK—either as a single-ended clock signal or as a pair of complementary clock signals—simultaneously and/or in parallel with the input of data signals DQ(1) to DQ(N).

The receiving circuit 104 has data path circuitry 300(1)-300(N) connected to the respective data contacts 112(1)-112(N). Briefly, the data path circuitry 300 may contain on-die termination (ODT) and a data receiver. The receiving circuitry is connected to a sampling circuit 310, which could include a data latch. Further details of an embodiment of the receiving circuitry and sampling circuit are shown and described with respect to FIG. 3. The receiving circuit 104 has a voltage generator 150, which is configured to provide a separate reference voltage (Vref) to the data receiver in each data path circuitry 300.

In general, the term data path may be used herein to describe the path from a data driver 118, along a data line 108, through a data contact 112, through data path circuitry 300, to the sampling circuit 310. There is a separate data path for each data line 108. There can be significant variation between the data paths, which present challenges in properly identifying the data signal at the sampling circuit 310. Examples of such variations include, but are not limited to, mismatches between the data drivers 118, mismatches between the data lines 108, and mismatches between the data path circuitry 300. In embodiments disclosed herein, the voltage generator 150 provides separate Vrefs to the data path circuitry 300 to mitigate such variations between the data paths. Moreover, the Vref can be calibrated for each data path.

The transmitting circuit 102 and the receiving circuit 104 form a source synchronous system. A source synchronous system is a system in which a transmitting (or source) circuit sends a data signal along with a clock signal to a receiving (or destination) circuit in order for the receiving circuit to use the clock signal to identify the data values of the data signal. In the system 100, the transmitting circuit 102 is the source circuit, and the receiving circuit 104 is the destination circuit. However, as transceiver circuits, the transmitting circuit 102 and the receiving circuit 104 may change roles. For example, in certain operations, circuit 104 sends a clock signal and a data signal to circuit 102, and circuit 102 uses the clock signal to identify the data values of the data signal. For such operations, the circuit 104 becomes the transmitting or the source circuit, and the circuit 102 becomes the receiving or the destination circuit.

In general, a signal, such as the input clock signal CLK and the input data signals DQ may be at a level at a given point in time. As used herein, a level of a signal is a magnitude value, such as a voltage magnitude value or a current magnitude value. In some cases, the signal may be referred to as being at a high level or at a low level, transitioning between a high level and a low level, or transitioning between a low level and a high level. A high level of a signal may be a single high level, a level that is within a set or range of high levels, a maximum high level or a minimum high level of a set or range of high levels, or an average high level of a set or range of high levels. Similarly, a low level of a signal may be a single low level, a level that is within a set or range of low levels, a maximum low level or a minimum low level of a set or range of low levels, or an average low level of a set or range of low levels.

Figure 2:
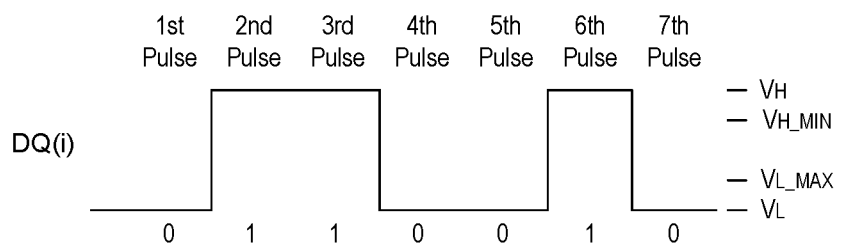
FIG. 2 is an example timing diagram of a data signal.

With reference to FIG. 2, a high level of a signal is a level that is at or above a minimum high level $V_{H\_MIN}$, and a low level of the signal is a level that is at or below a maximum low level $V_{L\_MAX}$. The minimum high level $V_{H\_MIN}$ and the maximum low level $V_{L\_MIN}$ may be predetermined levels or values, and in particular example configurations, predetermined levels or values specified as part of a swing requirement with which the source circuit 102 is configured to comply when transmitting the signal. A signal that transitions according to and/or in compliance with the swing requirement transitions to a high level that is at or above the minimum high level $V_{H\_MIN}$ of the swing requirement, and transitions to a low level that is at or below the maximum low level $V_{L\_MAX}$ of the swing requirement.

In general, a signal performs transitions between its high level and its low level. A given transition of a signal may be one of two transition types, including a rising transition and a falling transition. A signal performs a rising transition when the signal transitions from its low level to its high level, and performs a falling transition when the signal transitions from its high level to its low level.

A portion of a magnitude waveform of a signal over a transition is referred to as an edge. In particular, a portion of the magnitude waveform over a rising transition is a rising edge and a portion of the magnitude waveform over a falling transition is a falling edge.

Also, a clock signal, such as the input clock signal CLK, is a signal that has repetitive cycles occurring over successive periods T. Within a cycle, one of the portions is at a high level and the other portion is at a low level. Accordingly, the portions may be defined by consecutive rising and falling transitions or edges of the clock signal. For example, a given rising edge or a given falling edge may define or mark a boundary when one portion ends and a next portion, either of the same cycle or of a next cycle, begins.

In addition, a clock signal may include clock pulses that are formed or defined by the rising and falling edges of the clock signal. In particular example configurations, the clock pulses of a clock signal correspond to the high level of the clock signal, in that each clock pulse is defined by a rising edge followed by a period where the clock signal is at its high level, and then followed by a falling edge. A pulse width of a given clock pulse is a time duration extending from a time that the magnitude of the rising edge of the clock pulse is at or rises to a predetermined level (e.g., 50% of the high level) to a time that the magnitude of the falling edge of the clock pulse is at or falls to the predetermined level. The clock pulses of the clock signal may occur according to the frequency of the clock signal.

Additionally, a data signal is a signal that carries and/or includes data. The data carried by and/or included in a data signal includes a sequence of bits, where each bit includes or has a single-bit logic value of "1" or "0". The data signal may include a series or sequence of data pulses corresponding to a bit sequence of the data. Each data pulse may be at a level that indicates a data value, otherwise referred to as a logic level or a logic value. In addition, each data value is represented by a binary number or a binary value that includes one or more digits corresponding to and/or representing the one or more bits of the bit sequence. A duration of a data pulse is an amount of time that the level of the data pulse indicates the data value that the data pulse represents.

FIG. 2 shows a timing diagram of magnitude waveform of a portion of an example ith data signal DQ(i) representative of one of the input data signals DQ(1) to DQ(N). For purposes of illustration, the ith data signal DQ(i) shown in FIG. 2 includes seven data pulses. Each data pulse is shown as being either at a high level at or above a minimum high level $V_{H\_MIN}$ or at a low level at or below a maximum low level $V_{L\_MAX}$. For the example data signal DQ(i) in FIG. 2, the high level and the low level each indicate a single-bit logic value of "1" or "0", where the high level corresponds to and/or indicates a single-bit logic value of "1" (otherwise referred to as a logic 1 value) and the low level corresponds to and/or indicates a single-bit logic value of "0" (otherwise referred to as a logic 0 value). Other example data signals where different levels of the magnitude waveform correspond to and/or indicate multi-bit logic values (i.e., logic values that each include two or more digits or bits) may be possible.

For two consecutive data pulses of the ith data signal DQ(i), where the two consecutive pulses correspond to different logic levels, the data signal DQ(i) performs a rising transition or a falling transition to transition between the two consecutive data pulses. For the example shown in FIG. 2, where one pulse in the sequence indicates a logic 0 value and a next pulse in the sequence indicates a logic 1 value, the ith data signal DQ(i) performs a rising transition to transition between the first and second pulses. On the other hand, where one pulse corresponds to a logic 1 value and a next pulse indicates a logic 0 value, the ith data signal DQ(i) performs a falling transition to transition between the first and second pulses. In addition, where two consecutive pulses indicate the same logic level, then as the pulse sequence transitions from the first data pulse to the next data pulse, the level of the ith data signal DQ(i) stays the same during those two pulses, and a rising transition or a falling transition may not occur. Regardless of whether a change in level of the ith data signal DQ(i) occurs when transitioning between two consecutive data pulses, the start of a given data pulse is referred to as a starting transition of the data pulse, and the end of a given data pulse is referred to as an ending transition of the data pulse.

Figure 3:
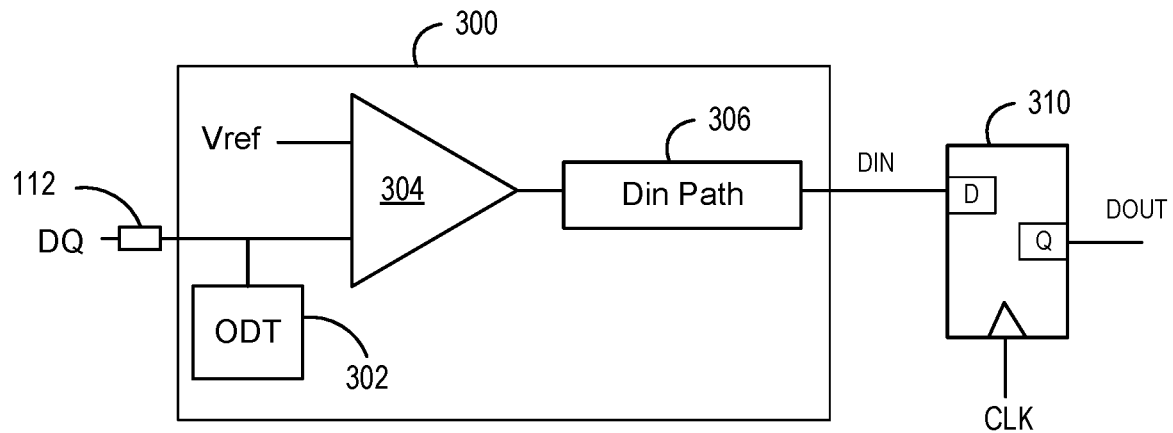
FIG. 3 depicts one embodiment of receiving circuitry and a sampling circuit.

FIG. 3 depicts one embodiment of data path circuitry 300 and sampling circuit 310. The receiving circuit has separate data path circuitry 300 and sampling circuit 310 for each data path. The data path circuitry 300 has on-die termination (ODT) 302 connected to the data contact 112. The ODT 302 includes one or more termination resistors for impedance matching to the data line 108 to which the ODT 302 is connected. In one embodiment, the ODT 302 includes center tap termination. In one embodiment, the ODT 302 includes low voltage termination logic. There could be significant variation between the ODTs 302 for the different data paths. Embodiments that provide a separate Vref for each data receiver 304 mitigate variations between the ODTs 302.

The data path circuitry 300 has a data receiver 304 that has one input connected to the data contact 112 (as well as ODT 302) and another input that receives a reference voltage (Vref). The data receiver 304 compares the data signal with Vref and outputs a result based on the comparison. For example, if the present magnitude of the data signal is greater than Vref, then the data receiver 304 outputs a high magnitude voltage, and if the present magnitude of the data signal is less than Vref, then the data receiver 304 outputs a low magnitude voltage. The output of the data receiver 304 is propagated along a data in path (Din Path) 306, and is provided to sampling circuit 310.

The sampling circuit 310 performs sampling actions to identify data values of data carried by the input data signals DQ. As used herein, a sampling action is an action performed to determine, identify, detect, capture, obtain, or latch onto, a level or magnitude of a signal at a given point in time. A sampling circuit may include an input terminal configured to receive the input signal. In addition, a sampling circuit may output or present the level of the input signal that it identifies. The sampling circuit may do so by generating an output signal at an output terminal of the sampling circuit at a level that indicates or corresponds to the level of the input signal. Accordingly, a sampling circuit samples an input signal, samples a level of the input signal, and outputs an output signal at a level indicating the level of the input signal.

In addition, a sampling circuit performs sampling actions in response to detecting a transitions in a clock. The clock transition may be a rising transition or a falling transition, although in some embodiments, sampling transitions may include both rising transitions and falling transitions. Each time a sampling circuit detects a clock transition, the sampling circuit samples the input signal. The input signal that a sampling circuit samples is referred to as its input data signal, and the output signal that a sampling circuit generates and outputs in response to performing sampling actions on the input signal is referred to as its output data signal.

There is a separate sampling circuit 310 for each input data signal D1(1) to DQ(N). Each of the sampling circuits is configured to sample the levels of a respective one of the data signals DQ(1) to DQ(N). An example sampling circuit is a flip flop, such a D flip flop for example. The sampling circuit 310 includes a data input terminal or node D, a data output terminal or node Q, and a clock input terminal (identified by the triangle). The data input terminal D is configured to receive an input data signal DIN of which the sampling circuit 310 is configured to sample. The clock input terminal is configured to receive a clock signal CLK of which the sampling circuit 310 is configured to detect sampling transitions. The data output terminal Q is configured to output an output data signal DOUT at levels and at times based on the levels of the input data signal DIN and the sampling transitions of the clock signal CLK. In particular, the sampling circuit 310 is configured to detect when each of the sampling transitions of the clock signal CLK occur. When the sampling circuit 310 detects that a sampling transition occurs, the sampling circuit 310 samples the level of the input data signal DIN at the data input terminal D, and generates the output data signal DOUT at the level of the input data signal DIN. The sampling circuit 310 maintains or holds the output data signal DOUT at the data output terminal Q at the level it identified until it detects the next sampling transition of the clock signal CLK. Upon detecting the next sampling transition of the clock signal CLK, the sampling circuit 310 will again identify the level of the input data signal DIN at the data input terminal D, and generate the output data signal DOUT at the level of the input data signal DIN in response to the next sampling transition. The sampling circuit 310 may continue to operate in this manner as it continues to receive additional data pulses of the input data signal DIN and detect sampling transitions of the clock signal CLK.

Figure 4:
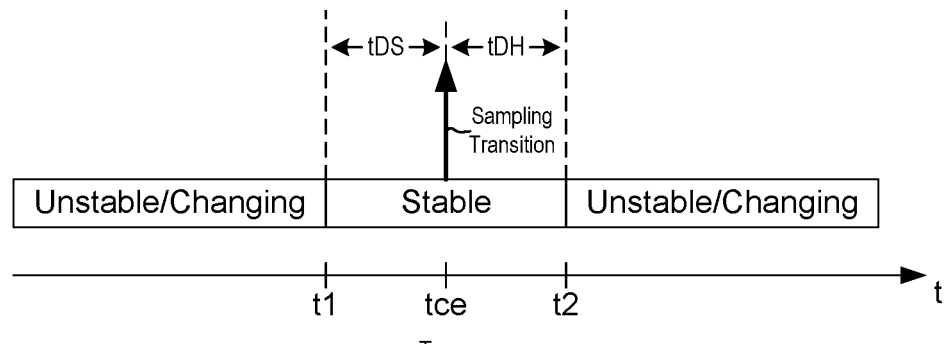
FIG. 4 is a schematic diagram of setup and hold time requirements of the sampling circuit of FIG. 3.

FIG. 4 is a schematic diagram illustrating setup time and hold time requirements of the sampling circuit 310. A sampling transition of the clock signal CLK is shown as occurring at a clock event time tce. An occurrence of a sampling transition of the clock signal CLK may be referred to as a clock event. When the sampling circuit 310 detects a sampling transition, it detects a clock event. A time duration from a first time t1 to the clock event time tce denotes the setup time tDS, and a time duration from the clock event time tce to a second time denotes the hold time tDH. In order to meet the setup and hold requirements of the sampling circuit 310, the level of a data pulse of the input data signal DIN should be stable from the first time t1 to the second time t2. A setup violation occurs when the level of input data signal DIN is unstable (it is still changing) after the first time t1 occurs. In other words, a setup violation occurs when the actual amount of time that the level of the input data signal DIN is stable before occurrence of the sampling transition at the clock event time tce is less than the amount of the setup time tDS. In addition, a hold violation occurs when the level of the input data signal DIN is unstable (it changes) before the second time t2. In other words, a hold violation occurs when the actual amount of time that the level of the input data signal DIN is stable after occurrence of the sampling transition at the clock event time tce is less than the amount of the hold time tDH.

For a data pulse of the input data signal DIN, at least a portion of the duration that a level of the data pulse is stable—e.g., at least a portion of the duration that the data pulse is at the high level or at the low level—defines a data valid window $T_{DVW}$. A data valid window $T_{DVW}$ is a time period or duration over which a given data pulse occurs during which a sampling circuit is to detect a sampling transition of the clock signal in order to avoid a setup violation and a hold violation. If the sampling transition occurs before the start of the data valid window $T_{DVW}$, then a setup violation occurs—either because the sampling transition occurred before the starting transition of the data pulse, or because the sampling transition occurred too close to after the starting transition that the actual amount of time that the level of the data pulse is stable before occurrence of the sampling transition is less than the setup time tDS. In addition, if the sampling transition occurs after the end of the data valid window $T_{DVW}$, then a hold violation occurs—either because the sampling transition occurred after the ending transition of the data pulse or occurred too close to before the ending transition that the actual amount of time that the level of the data pulse is stable after occurrence of the sampling transition is less than the hold time tDH. Embodiments of on-die per pin Vref generation provide for a wide data valid window $T_{DVW}$.

Ideally, the sampling circuit 310 receives the clock signal CLK and the input data signal DIN relative to each other such that the sampling circuit 310 reliably or accurately samples the level of each data pulse in order to correctly identify the data value that each data pulse represents. Configuring the sampling circuit 310 to sample each data pulse in the middle or at a middle point of the duration of each pulse may maximize the chances of this ideal situation occurring. The ideal time at which to sample a data pulse is referred to as a target sampling time of the data pulse. Ideally, the sampling circuit 310 identifies sampling transitions in the middle of the durations of the data pulses and/or at the target sampling times of the data pulses. Accordingly, a given sampling transition is in a target sampling position when the sampling transition occurs at the target sampling time of its associated data pulse.

Figure 5:
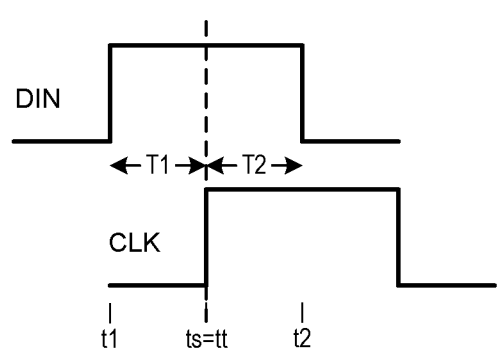
FIG. 5 is a timing diagram of a sampling transition of a clock signal in a target sampling position.

FIG. 5 shows a data pulse of the input data signal DIN and a pulse of the clock signal CLK, illustrating the ideal case where a sampling transition of the clock pulse is in the target sampling position. In FIG. 5, a starting transition of the data pulse occurs at a first time t1, and an ending transition of the data pulse occurs at a second time t2. A target sampling time tt of the data pulse occurs in the middle between the first time t1 and the second time t2. Accordingly, a first time period T1 extending from the first time t1 to the target sampling time tt is the same as or equal to a second time period T2 extending from the target sampling time tt to the second time t2. Additionally, the sampling transition associated with the data pulse is the rising transition of the clock pulse. The sampling transition occurs at a sampling time ts. In FIG. 5, for the ideal case, the sampling transition occurs at the target sampling time—i.e., the sampling time ts and the target sampling time tt are the same.

In actuality, when the transmitting circuit 102 sends the data signals DQ and the clock signal CLK to the receiving circuit 104, the sampling circuitry of the receiving circuit 104 may not receive the clock pulses in their respective target sampling positions. For a given sampling circuit that samples data pulses of an input data signal in response to sampling transitions of a clock signal, where the sampling transitions occur at times different than the target sampling times tt, the input data signal and the clock signal have skew between them. In general, as used herein, skew between a clock signal and a data signal is a deviation of a sampling transition of the clock signal from a target sampling position to sample a data pulse of the data signal. In addition, with respect to sampling times, skew between a clock signal and a data signal is a deviation of a sampling time ts from a target sampling time tt to sample a data pulse of a data signal. For a given pair of clock and data signals, where the clock signal performs sampling transitions at sampling times ts that match or occur at the same times as the target sampling times tt, the clock and data signals do not have skew between them. Alternatively, where the clock signal performs sampling transitions at sampling times ts different than the target sampling times tt (i.e., before or after the target sampling times tt), the clock and data signals have skew between them. An amount of skew (or skew amount) may be quantified by the difference in time between the sampling time ts and the target sampling time tt.

Figure 6A:
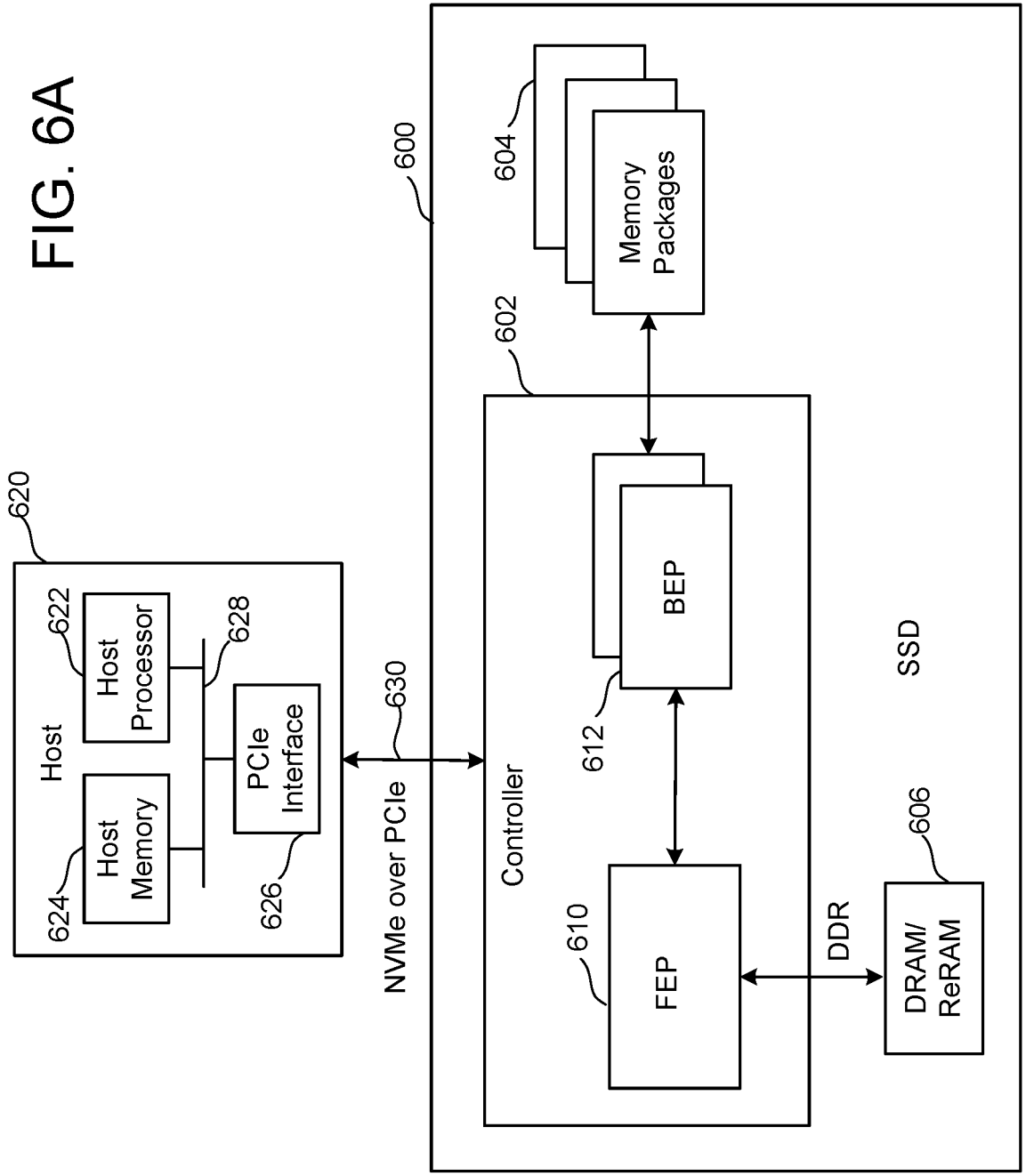
FIG. 6A is a block diagram of one embodiment of a storage device connected to a host.

FIGS. 6A, 6B, 7, 8, 9A and 9B depict an example memory system in which embodiments may be practiced. FIG. 6A is a block diagram of one embodiment of a memory system 600 connected to a host system 620. Memory system 600 can implement the technology proposed herein. Many different types of storage devices can be used with the technology proposed herein. One example storage device is a solid state device (SSD); however, other types of storage devices can also be used. Memory system 600 comprises a memory controller 602, non-volatile memory 604 for storing data (or memory packages), and local memory (e.g. DRAM/ReRAM) 606. Memory controller 602 comprises a Front End Processor Circuit (FEP) 610 and one or more Back End Processor Circuits (BEP) 612. In one embodiment, FEP 610 circuit is implemented on an ASIC. In one embodiment, each BEP circuit 612 is implemented on a separate ASIC. The ASICs for each of the BEP circuits 612 and the FEP circuit 610 are implemented on the same semiconductor such that the Controller 602 is manufactured as a System on a Chip (SoC). FEP 610 and BEP 612 both include their own processors. In one embodiment, FEP 610 and BEP 612 work as a master slave configuration where the FEP 610 is the master and each BEP 612 is a slave. For example, FEP circuit 610 implements a flash translation layer that performs memory management (e.g., garbage collection, wear leveling, etc.), logical to physical address translation, communication with the host, management of DRAM (local volatile memory) and management of the overall operation of the SSD (or other non-volatile storage device). The BEP circuit 612 manages memory operations in the memory packages/die at the request of FEP circuit 110. For example, the BEP circuit 612 can carry out the read, erase and programming processes. Additionally, the BEP circuit 612 can perform buffer management, set specific voltage levels required by the FEP circuit 610, perform error correction, control the Toggle Mode interfaces to the memory packages, etc. In one embodiment, each BEP circuit 612 is responsible for its own set of memory packages.

In one embodiment, non-volatile memory 604 comprises a plurality of memory packages. Each memory package includes one or more memory die. Therefore, memory controller 602 is connected to one or more non-volatile memory die. In one embodiment, each memory die in the memory packages 604 utilize NAND flash memory (including two dimensional NAND flash memory and/or three dimensional NAND flash memory). In other embodiments, the memory package can include other types of memory.

Memory controller 602 communicates with host 620 via an interface 630 that implements NVM Express (NVMe) over PCI Express (PCIe). For working with memory system 600, host 620 includes a host processor 622, host memory 624, and a PCIe interface 626 connected to bus 628. Host memory 624 is the host's physical memory, and can be DRAM, SRAM, non-volatile memory or another type of storage. Host system 620 is external to and separate from memory system 600. In one embodiment, memory system 600 is embedded in host system 620. Any combination of one or more of memory package(s) 604, memory system 600, and/or host system 620 in combination with memory system 600 may be referred to herein as an apparatus. However, the term apparatus is not limited thereto. In operation, when the host system 620 needs to read data from or write data to the non-volatile memory 604, it will communicate with the controller 602. If the host 620 provides a logical address to which data is to be read/written, the controller can convert the logical address received from the host to a physical address in the non-volatile memory 604.

Figure 6B:
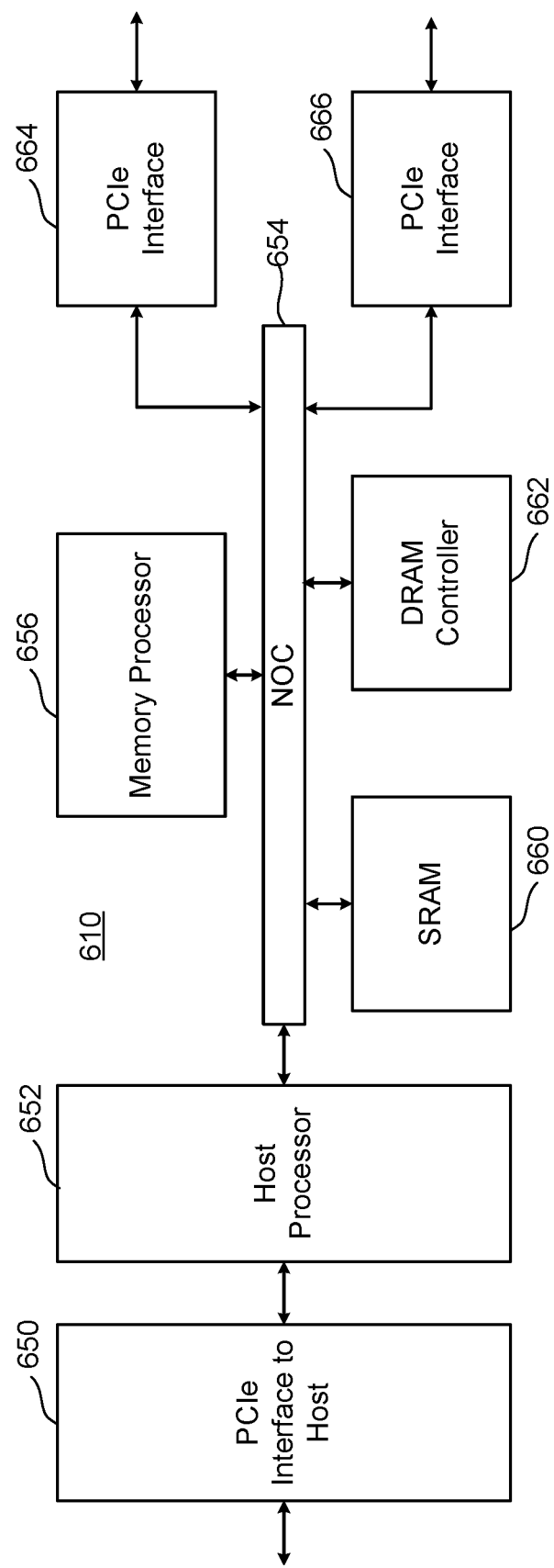
FIG. 6B is a block diagram of one embodiment of a Front End Processor Circuit. In some embodiments, the Front End Processor Circuit is part of a Controller.

FIG. 6B is a block diagram of one embodiment of FEP circuit 610. FIG. 6B shows a PCIe interface 650 to communicate with host 620 and a host processor 652 in communication with that PCIe interface. The host processor 652 can be any type of processor known in the art that is suitable for the implementation. Host processor 652 is in communication with a network-on-chip (NOC) 654. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 654 is the memory processor 656, SRAM 660 and a DRAM controller 662. The DRAM controller 662 is used to operate and communicate with the DRAM (e.g., DRAM 606). SRAM 660 is local RAM memory used by memory processor 656. Memory processor 656 is used to run the FEP circuit and perform the various memory operations. Also in communication with the NOC are two PCIe Interfaces 664 and 666. In the embodiment of FIG. 6B, the SSD controller will include two BEP circuits 612; therefore there are two PCIe Interfaces 664/666. Each PCIe Interface communicates with one of the BEP circuits 612. In other embodiments, there can be more or less than two BEP circuits 612; therefore, there can be more than two PCIe Interfaces.

Figure 7:
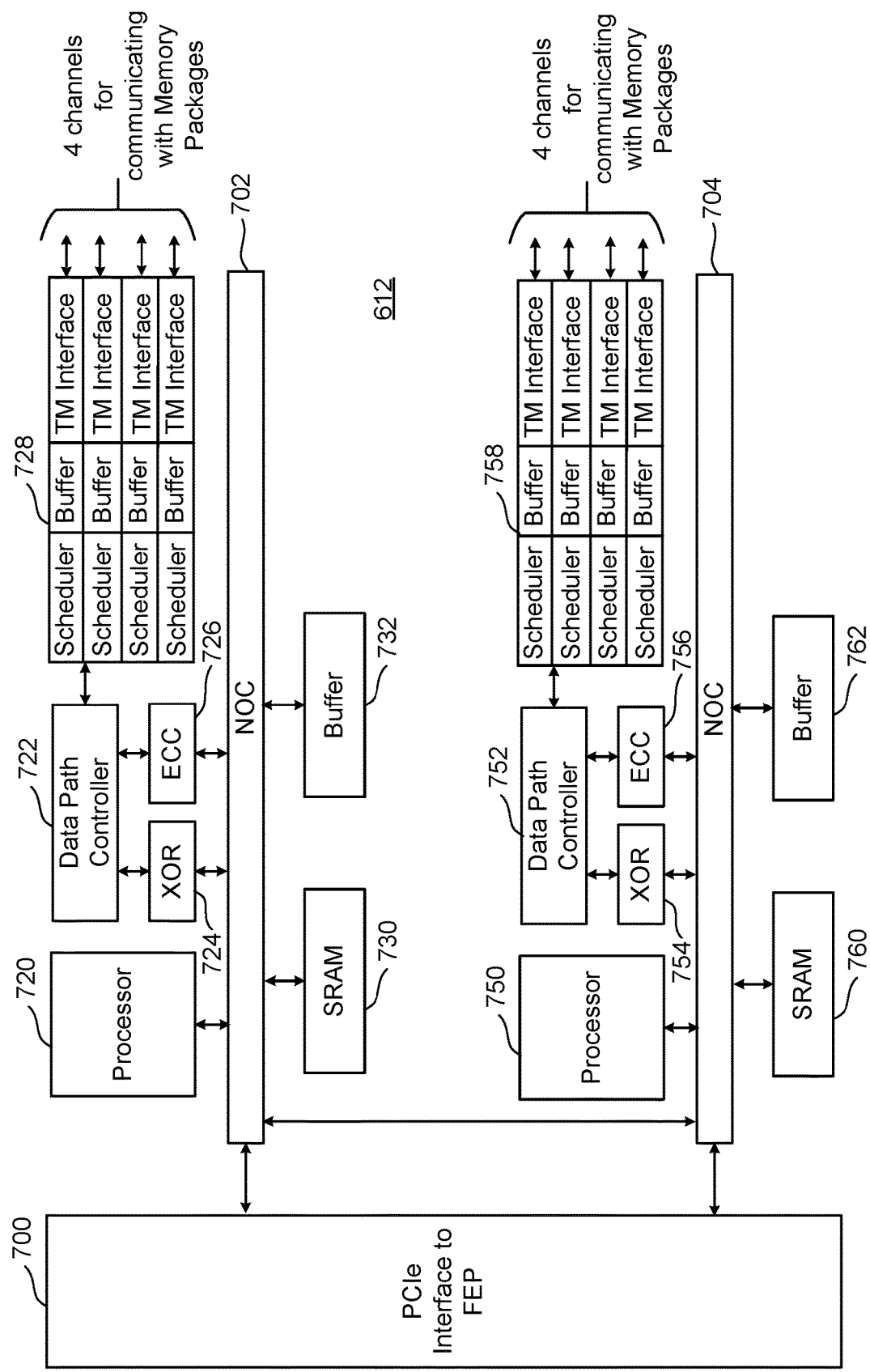
FIG. 7 is a block diagram of one embodiment of a Back End Processor Circuit. In some embodiments, the Back End Processor Circuit is part of a Controller.

FIG. 7 is a block diagram of one embodiment of the BEP circuit 612. FIG. 7 shows a PCIe Interface 700 for communicating with the FEP circuit 610 (e.g., communicating with one of PCIe Interfaces 664 and 666 of FIG. 6B). PCIe Interface 700 is in communication with two NOCs (Network-on-a-Chip) 702 and 704. In one embodiment, the two NOCs can be combined to one large NOC. Each NOC (702/704) is connected to SRAM (730/760), a buffer (732/762), processor (720/750), and a data path controller (722/752) via an XOR engine (724/754) and an ECC engine (726/756). The ECC engines 726/756 are used to perform error correction, as known in the art. The XOR engines 724/754 are used to XOR the data so that data can be combined and stored in a manner that can be recovered in case there is a UECC failure. In an embodiment, XOR engines 724/754 form a bitwise XOR of different pages of data. The XOR result may be stored in a memory package 604. In the event that an ECC engine 726/756 is unable to successfully correct all errors in a page of data that is read back from a memory package 604, the stored XOR result may be accessed from the memory package 604. The page of data may then be recovered based on the stored XOR result, along with the other pages of data that were used to form the XOR result.

Data path controller 722 is connected to an interface module for communicating via four channels with memory packages. Thus, the top NOC 702 is associated with an interface 728 for four channels for communicating with memory packages and the bottom NOC 704 is associated with an interface 758 for four additional channels for communicating with memory packages. Each interface 728/758 includes four Toggle Mode interfaces (TM Interface), four buffers and four schedulers. There is one scheduler, buffer and TM Interface for each of the channels. The processor can be any standard processor known in the art. The data path controllers 722/752 can be a processor, FPGA, microprocessor or other type of controller. The XOR engines 724/754 and ECC engines 726/756 are dedicated hardware circuits, known as hardware accelerators. In other embodiments, the XOR engines 724/754 and ECC engines 726/756 can be implemented in software. The scheduler, buffer, and TM Interfaces are hardware circuits.

Interfaces 728/758, alone or in combination, may be referred to as a memory interface configured to be connected to non-volatile memory (e.g., memory package 604). A combination of one or more of processor 720/750, data path controller 722/752, XOR 724/754, ECC 726/756 may be referred to herein as a processor circuit. The buffer 732/762, SRAM 730/760, and/or NOCs 702/704 may also be considered to be a part of the processor circuit.

Figure 8:
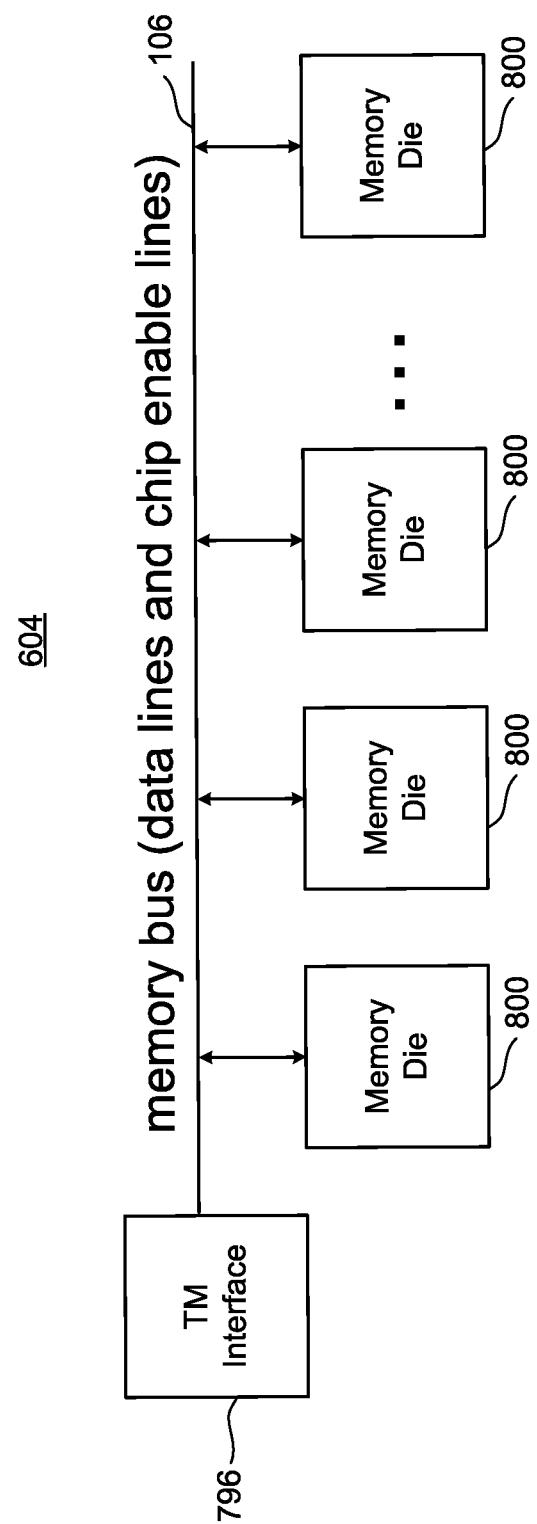
FIG. 8 is a block diagram of one embodiment of a memory package.

FIG. 8 is a block diagram of one embodiment of a memory package 604 that includes a plurality of memory die 800 connected to a memory bus (data lines and chip enable lines) 106. The memory bus 106 connects to a Toggle Mode Interface 796 for communicating with the TM Interface of a BEP circuit 612 (see e.g., FIG. 7). In some embodiments, the memory package can include a small controller connected to the memory bus and the TM Interface. The memory package can have one or more memory die. In one embodiment, each memory package includes eight or 16 memory dies; however, other numbers of memory dies can also be implemented. The technology described herein is not limited to any particular number of memory dies.

Figure 9A:
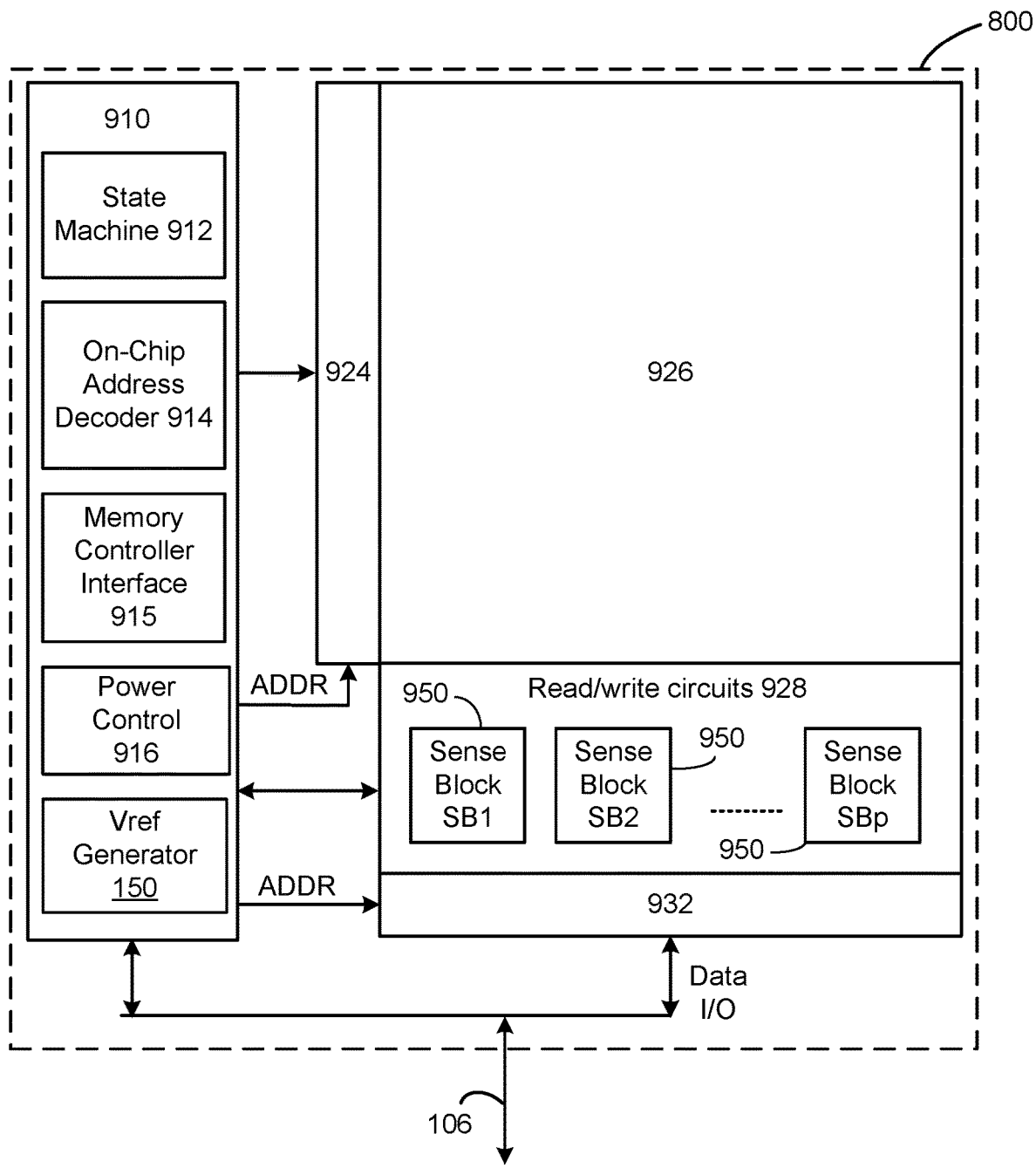
FIG. 9A is a block diagram of one embodiment of a memory die.

FIG. 9A is a functional block diagram of one embodiment of a memory die 800. Each of the one or more memory die 800 of FIG. 8 can be implemented as memory die 800 of FIG. 9A. The components depicted in FIG. 9A are electrical circuits. In one embodiment, each memory die 800 includes a memory structure 926, control circuitry 910, and read/write circuits 928, all of which are electrical circuits. Memory structure 926 is addressable by word lines via a row decoder 924 and by bit lines via a column decoder 932. The read/write circuits 928 include multiple sense blocks 950 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller 602 and the memory die 800 via memory controller interface 915. The memory controller interface 915 may also be referred to herein as a communication interface. Examples of memory controller interface 915 include a Toggle Mode Interface and an Open NAND Flash Interface (ONFI). Other I/O interfaces can also be used.

Control circuitry 910 cooperates with the read/write circuits 928 to perform memory operations (e.g., write, read, erase, and others) on memory structure 926. In one embodiment, control circuitry 910 includes a state machine 912, an on-chip address decoder 914, a power control module 916, a memory controller interface 915, and Vref generator 150. State machine 912 provides die-level control of memory operations. In one embodiment, state machine 912 is programmable by software. In other embodiments, state machine 912 does not use software and is completely implemented in hardware (e.g., electrical circuits). In some embodiments, state machine 912 can be replaced by a microcontroller or microprocessor. In one embodiment, control circuitry 910 includes buffers such as registers, ROM fuses and other storage devices for storing default values such as base voltages and other parameters. The default values and other parameters could be stored in a region of the memory structure 926.

The on-chip address decoder 914 provides an address interface between addresses used by controller 602 to the hardware address used by the decoders 924 and 932. Power control module 916 controls the power and voltages supplied to the word lines and bit lines during memory operations. Power control module 916 may include charge pumps for creating voltages.

Memory controller interface 915 is an electrical interface for communicating with memory controller 602. For example, memory controller interface 915 may implement a Toggle Mode Interface that connects to the Toggle Mode interfaces of memory interface 228/258 for memory controller 602. In one embodiment, memory controller interface 915 includes a set of input and/or output (I/O) pins that connect to communication channel 106 (also refers to herein as a data bus). In one embodiment, communication channel 106 connects to the memory controller 602 as part of the Toggle Mode Interface. In one embodiment, data path circuitry 300 and sampling circuit 310 is within memory controller interface 915.

For purposes of this document, control circuitry 910, alone or in combination with read/write circuits 928 and decoders 924/932, comprise a control circuit configured to be connected to memory structure 926. This control circuit is an electrical circuit that performs the functions described below in the flow charts. In another alternative, the control circuit comprises controller 602 and control circuitry 910 performing the functions described below in the flow charts. In another embodiment, the control circuit comprises state machine 912 (and/or a microcontroller and/or microprocessor) alone or in combination with controller 602. In another alternative, the control circuit comprises controller 602, control circuitry 910, read/write circuits 928 and decoders 924/932 performing the functions described below in the flow charts. In other embodiments, the control circuit comprises one or more electrical circuits that operate the non-volatile memory.

In one embodiment, memory structure 926 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 926 comprise vertical NAND strings with charge-trapping material such as described, for example, in U.S. Pat. No. 9,721,662, incorporated herein by reference in its entirety. In another embodiment, memory structure 926 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 926 is not limited to the examples above. Many different types of memory array architectures or memory cell technologies can be used to form memory structure 926. No particular non-volatile memory technology is required for purposes of the new claimed embodiments proposed herein. Other examples of suitable technologies for memory cells of the memory structure 926 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 926 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 9B:
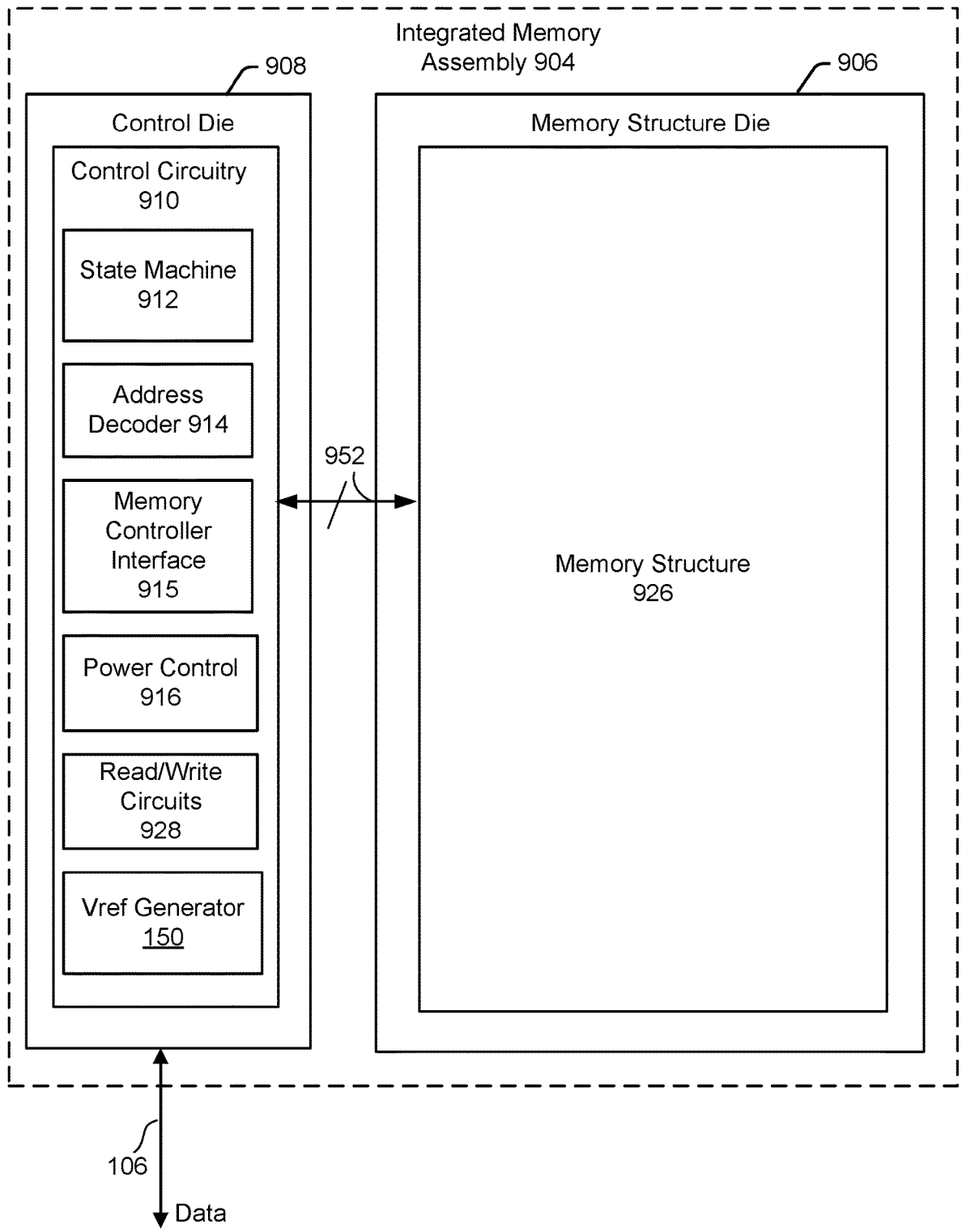
FIG. 9B depicts a functional block diagram of one embodiment of an integrated memory assembly.

FIG. 9B depicts a functional block diagram of one embodiment of an integrated memory assembly 904. The integrated memory assembly 904 may be used in a memory package 604 in memory system 600. In one embodiment, the integrated memory assembly 904 includes two types of semiconductor die (or more succinctly, "die"). Memory structure die 906 includes include memory structure 926. Memory structure 926 may contain non-volatile memory cells. Control die 908 includes control circuitry 910. In some embodiments, the memory structure die 906 and the control die 908 are bonded together. The control circuitry includes state machine 912, an address decoder 914, a power control circuit 916, memory controller interface 915, and Vref generator 150. In one embodiment, data path circuitry 300 and sampling circuit 310 is within memory controller interface 915. The control circuitry also includes read/write circuits 928. In another embodiment, a portion of the read/write circuits 928 are located on control die 908, and a portion of the read/write circuits 928 are located on memory structure die 906.

Any subset of components in the control circuitry 910 can be considered a control circuit. The control circuit can include hardware only or a combination of hardware and software (including firmware). For example, a controller programmed by firmware is one example of a control circuit. A control circuit can include a processor, PGA (Programmable Gate Array, FPGA (Field Programmable Gate Array), ASIC (Application Specific Integrated Circuit), integrated circuit or other type of circuit. The term apparatus as used herein may include, but is not limited to, memory die 800, memory package 604, integrated memory assembly 904, control die 908, memory system 600, or a host system 620 that includes a memory system 600.

Pathways 952 are pathways between one or more components in the control circuitry 910 and the memory structure on memory structure die 906. A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal.

In one embodiment, integrated memory assembly 904 includes a set of input and/or output (I/O) pins that connect to communication channel 106 (also refers to herein as a data bus). In one embodiment, communication channel 106 connects the memory controller 602 directly to control die 908.

Figure 10:
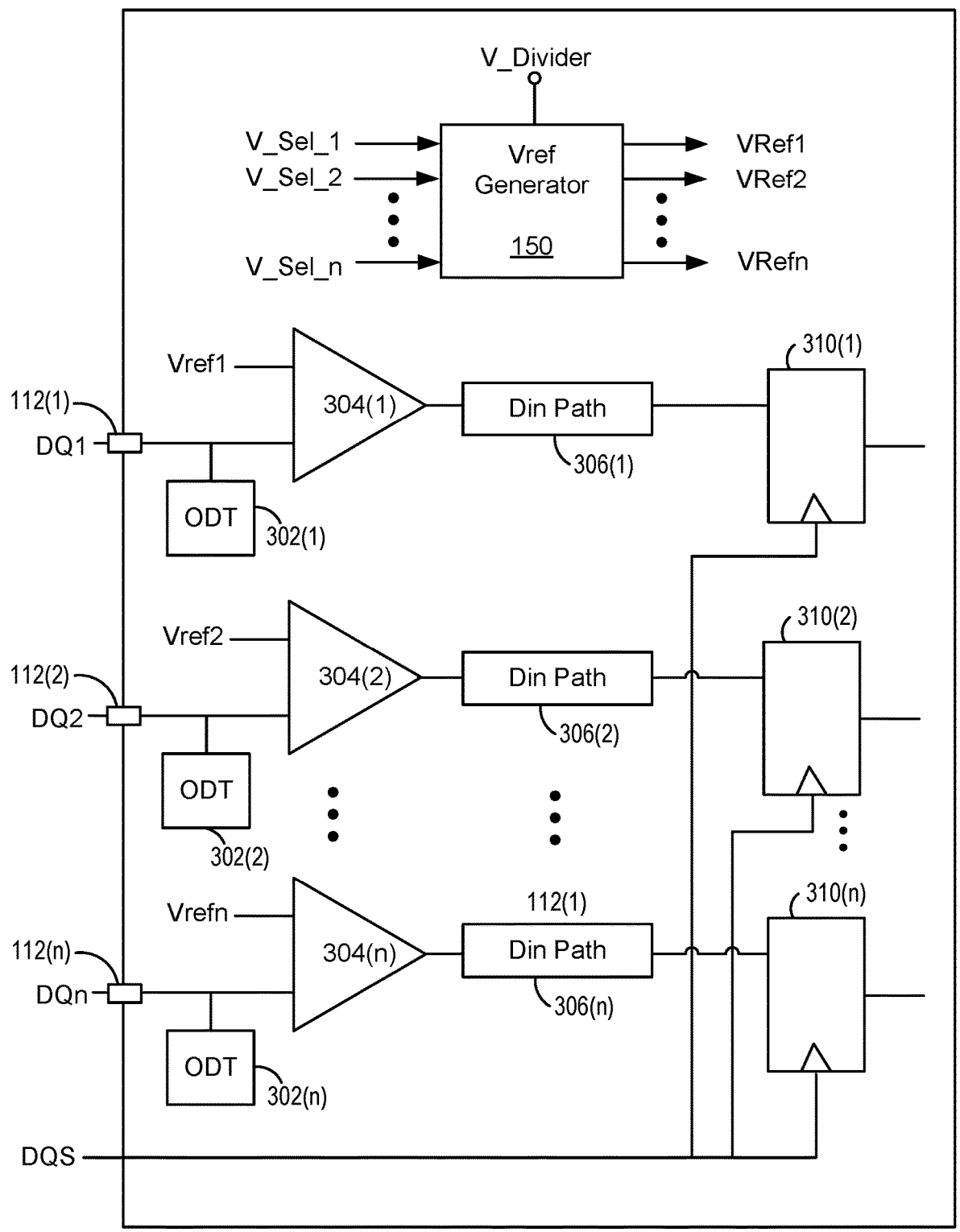
FIG. 10 is a block diagram of one embodiment of an apparatus for receiving data signals.

FIG. 10 is a block diagram of one embodiment of an apparatus 1000 for receiving data signals. In one embodiment, the apparatus is a memory die 800. In one embodiment, the apparatus is integrated memory assembly 904 or is within integrated memory assembly 904. In one embodiment, the apparatus is a control die 908 of an integrated memory assembly 904. In one embodiment, the apparatus is memory system 600 or is within memory system 600. In one embodiment, the apparatus is a device such as a laptop computer. Hence, the apparatus could be a combination of host system 620 and memory system 600. It will be appreciated that the apparatus may have other elements, which are not depicted in FIG. 10.

The apparatus 1000 has a number of data receivers 304(1)-304(n). Each data receiver 304 has one input connected to a data contact 112 (as well as ODT 302) and another input that receives a reference voltage (Vref). Each data receiver 304 has its own Vref, such that the Vref may be calibrated for that data path. Therefore, differences between the data paths are mitigated. These data path differences could be internal data path differences and/or external data path differences. The data receiver 304 compares the data signal that it receives with its Vref and outputs a result based on the comparison. The output of the data receiver 304 is propagated along a data in path (Din Path) 306, and is provided to sampling circuit 310. Sampling circuit 310 samples the output of the data receiver 304 in response to DQS, which is a clock signal or data strobe signal.

The Vref generator 150 is configured to output a separate Vref for each data receiver 304. For example, Vref1 is provided to data receiver 304(1), Vref2 is provided to data receiver 304(2), . . . Vrefn is provided to data receiver 304(n). The Vref generator 150 inputs a number of voltage magnitude select signals (e.g., V_Sel_1, V_Sel_2, . . . V_Sel_n). Each voltage magnitude select signal is used to select the magnitude of Vref for one of the data receivers 304.

Figure 11A:
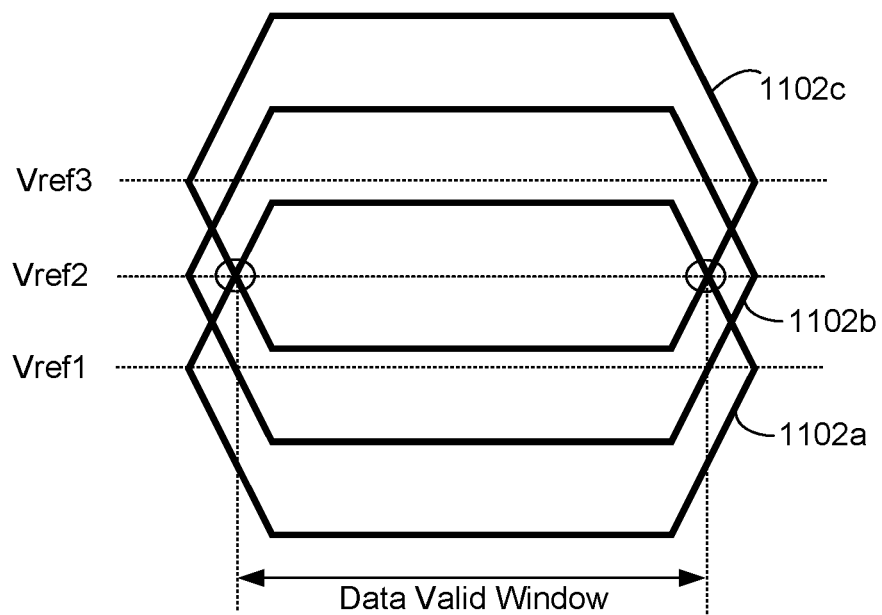
FIGS. 11A and 11B depict a number of eye diagrams.
Figure 11B:
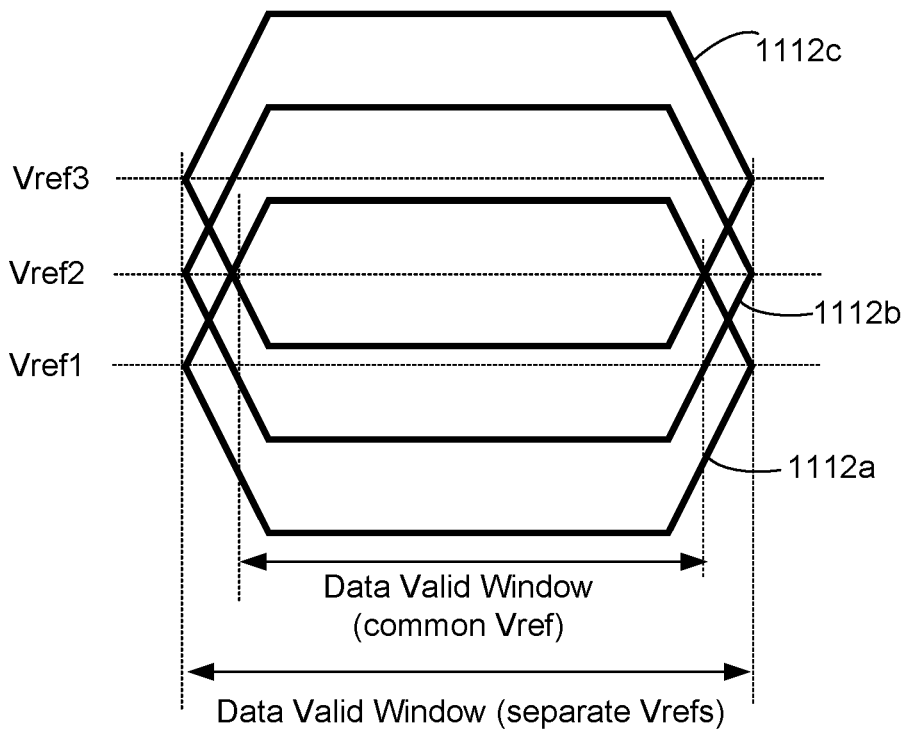

Using a separate Vref for each data receiver 304 results in a wider data valid window. FIGS. 11A and 11B will now be discussed to illustrate this benefit. FIG. 11A depicts a number of data eye diagrams. The data eye diagrams will be discussed to illustrate a shortcoming of using the same reference voltage for all data receivers. Each data eye diagram is for a different data path. Three data eye diagrams 1102a, 1102b, 1102c are depicted for purpose of discussion. An ideal reference voltage is shown for each data eye diagram. This is the reference voltage that would result in the widest data valid window, if it were to be used for the reference voltage for the data receiver for that data path. Specifically, Vref1 is shown for data eye diagram 1102a, Vref2 is shown for data eye diagram 1102b, and Vref3 is shown for data eye diagram 1102c. In this example, Vref2 is used as the actual reference voltage for all data paths. Thus, Vref2 is used as the actual reference voltage that is used for each data receiver.

Using the same reference voltage for all data receivers can shorten the data valid window. For example, for data eye diagram 1102a, using Vref1 would result in a data valid window that corresponds to where Vref1 intersects data eye diagram 1102a, which is the widest possible data valid window for that data eye diagram 1102a. However, using Vref2 will result in a data valid window that corresponds to where Vref2 intersects data eye diagram 1102a. This data valid window is labeled in FIG. 11A.

Similarly, for data eye diagram 1102c, using Vref3 would result in a data valid window that corresponds to where Vref3 intersects data eye diagram 1102c, which is the widest possible data valid window for that data eye diagram 1102c. However, using Vref2 will result in a data valid window that corresponds to where Vref2 intersects data eye diagram 1102c. In this example, this data valid window is labeled in FIG. 11A. In other examples the data valid window for eye diagrams 1102a, 1102c are not identical. However, this simple example is used to explain the concept of how a data valid window can be shortened by using the same Vref for all data paths.

FIG. 11B depicts a number of data eye diagrams. The data eye diagrams will be discussed to illustrate how in embodiments of using a separate reference voltage for each data receivers the data valid window can be widened. Each data eye diagram 1112a, 1112b, 1112c is for a different data path. In this example, Vref1 is used for the data receiver for the path having data eye diagram 1112a. Vref2 is used for the data receiver for the path having data eye diagram 1112b, and Vref3 is used for the data receiver for the path having data eye diagram 1112c. The data valid window for each data path is defined by the points at which the respective Vrefs intersect with the respective eye diagrams. The data valid window for separate Vrefs is labeled in FIG. 11B. For contrast, the data valid window for a common Vref (as in the case of FIG. 11A) is also labeled in FIG. 11B. Note that the data valid window for separate Vrefs is wider than the data valid window for a common Vref.

Figure 12:
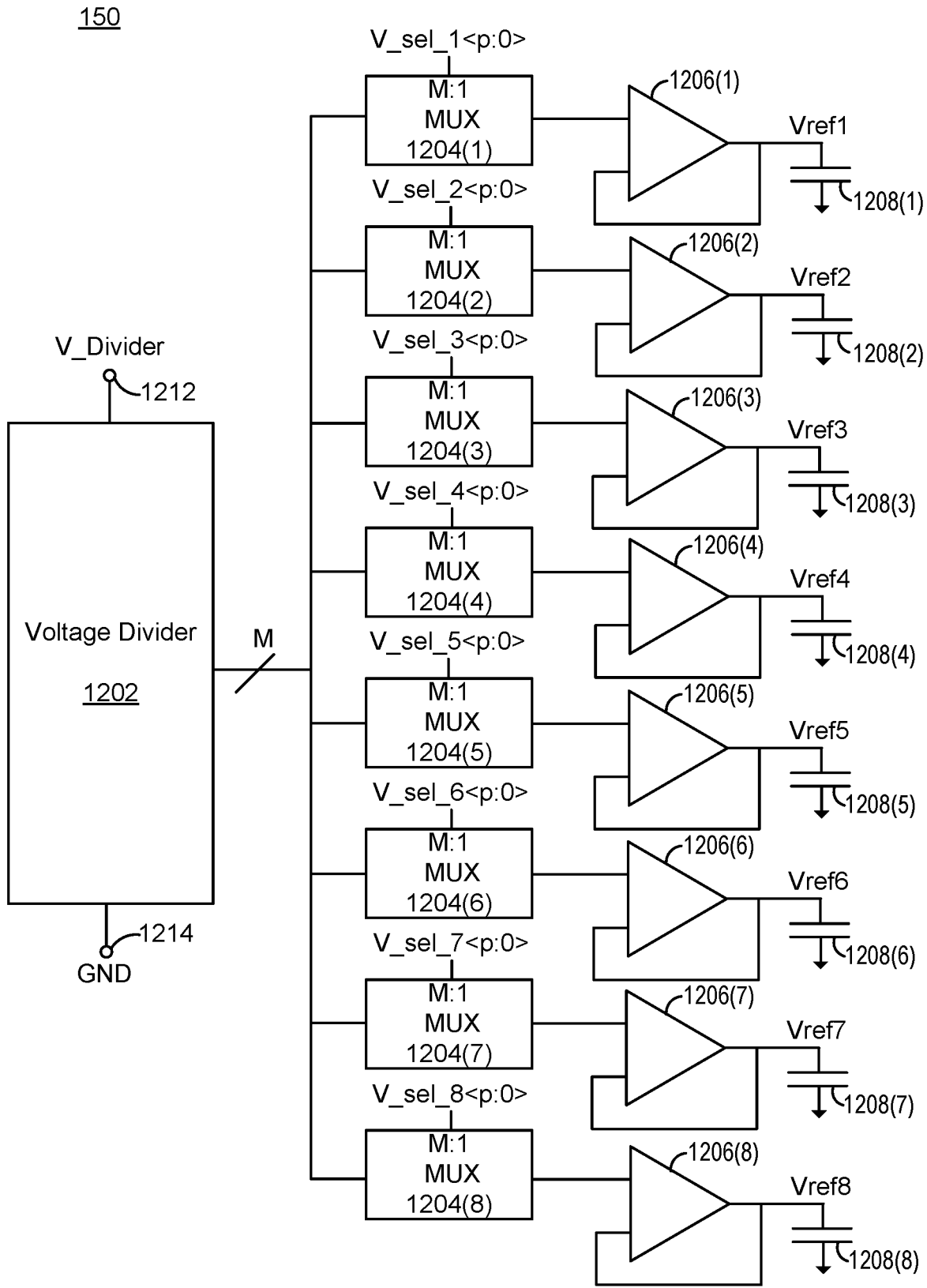
FIG. 12 is a block diagram of one embodiment of a Vref generator.

Providing the separate Vrefs from an on-die voltage generator could potentially require a large area, as well as consume considerable power and/or current. In some embodiments, a single voltage divider is used in the on-die voltage generator to save area, as well as power and/or current. FIG. 12 is a block diagram of one embodiment of the Vref generator 150, which uses a small amount of area. The Vref generator 150 is also power and current efficient. The Vref generator 150 has a voltage divider 1202, a number of multiplexers (MUX) 1204(1)-1204(n), a number of amplifiers 1206(1)-1206(n), and a number of output capacitors 1208(1)-1208(n).

The voltage divider 1202 has a first terminal 1212 and a second terminal 1214 that 1214 allow a voltage to be applied across the voltage divider. In this example, the first terminal 1212 receives V_Divider and the second terminal 1214 is connected to ground (GND). The voltage divider 1202 has M outputs, wherein M is an integer greater than 1. In one embodiment, M is 128, but could be larger or smaller. Each of the M outputs provides a voltage that is a different percentage of V_Divider.

Each of the M outputs is connected to each of the MUXes 1204. Thus, each MUX 1204 receives each of the M possible percentages of V_Divider. Each MUX 1204 also receives a select signal to select one of the input voltages. For example, MUX 1204(1) receives V_sel_1<p:0>. In this example, the select signal is a p+1 bit code. If M is 128, then the select signal may be a seven bit code. The select signals that are input to the MUXes 1204 correspond to the select signals in FIG. 10. For example, V_sel_1<p:0> in FIG. 12 corresponds to V_Sel_1 in FIG. 10.

The output of any given MUX 1204 is connected to an input of one of the amplifiers 1206. In this example, the amplifiers 1206 are unity gain amplifiers. However, the amplifiers 1206 are not required to have unity gain. In an embodiment in which the amplifiers 1206 have a gain other than one, all of the amplifiers 1206 have the same gain. The output of each amplifier 1206 is connected to an output capacitor 1208, which is connected to ground. The output of each amplifier 1206 is one of the Vrefs. Hence, the output of each respective amplifier 1206 may be connected to the Vref input of one of the data receivers (see 304, FIG. 10). Thus, Vref1-Vref8 in FIG. 12 correspond to Vref1-Vrefn that are output by the Vref generator 150 in FIG. 10. While FIG. 12 depicts an example in which there are eight separate Vrefs, there could be more or fewer than eight separate Vrefs. However, there should be a separate Vref for each data receiver 304.

Figure 13:
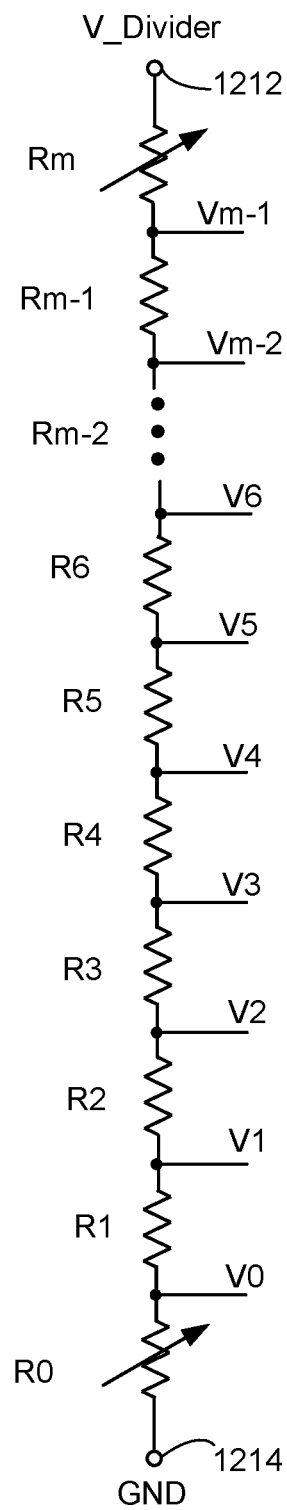
FIG. 13 depicts further details of one embodiment of a voltage divider in a Vref generator.

FIG. 13 depicts further details of one embodiment of the voltage divider 1202. The voltage divider 1202 has a number of series connected resistors R0-Rm. Consistent with the example in FIG. 12, terminal 1212 is connected to V_Divider and terminal 1214 is connected to GND. The voltage divider 1202 has M voltage outputs, which are labeled V0-Vm−1. The voltage at each voltage output is a different percentage of V_Divider. Each voltage output is between two of the series connected resistors. The M voltage outputs (V0-Vm−1) correspond to the M outputs of the voltage divider 1202 in FIG. 12. The topmost resistor Rm and the bottommost resistor R0 have adjustable resistances, which allows the range of the output voltages to be selected and/or calibrated. The resistors reside on the same semiconductor die as the data receivers 304. Hence, the voltage divider 1202 may be referred to as an on-die voltage divider 1202.

Using one common set of series connected resistors to provide the voltages for all of the MUXes 1204 saves area. Moreover, power and current consumption is reduced. During operation, the voltage V_Divider may be applied across the series connected resistor—at least whenever data is being received. Hence, a current will flow through the series connected resistors. However, the resistances of the series connected resistors can be relatively high in order to have a low current. Moreover, there need not be a separate structure to generate the Vref for each data receiver. Therefore, current and/power is saved relative to using a separate structure to generate the Vref for each data receiver.

Figure 14:
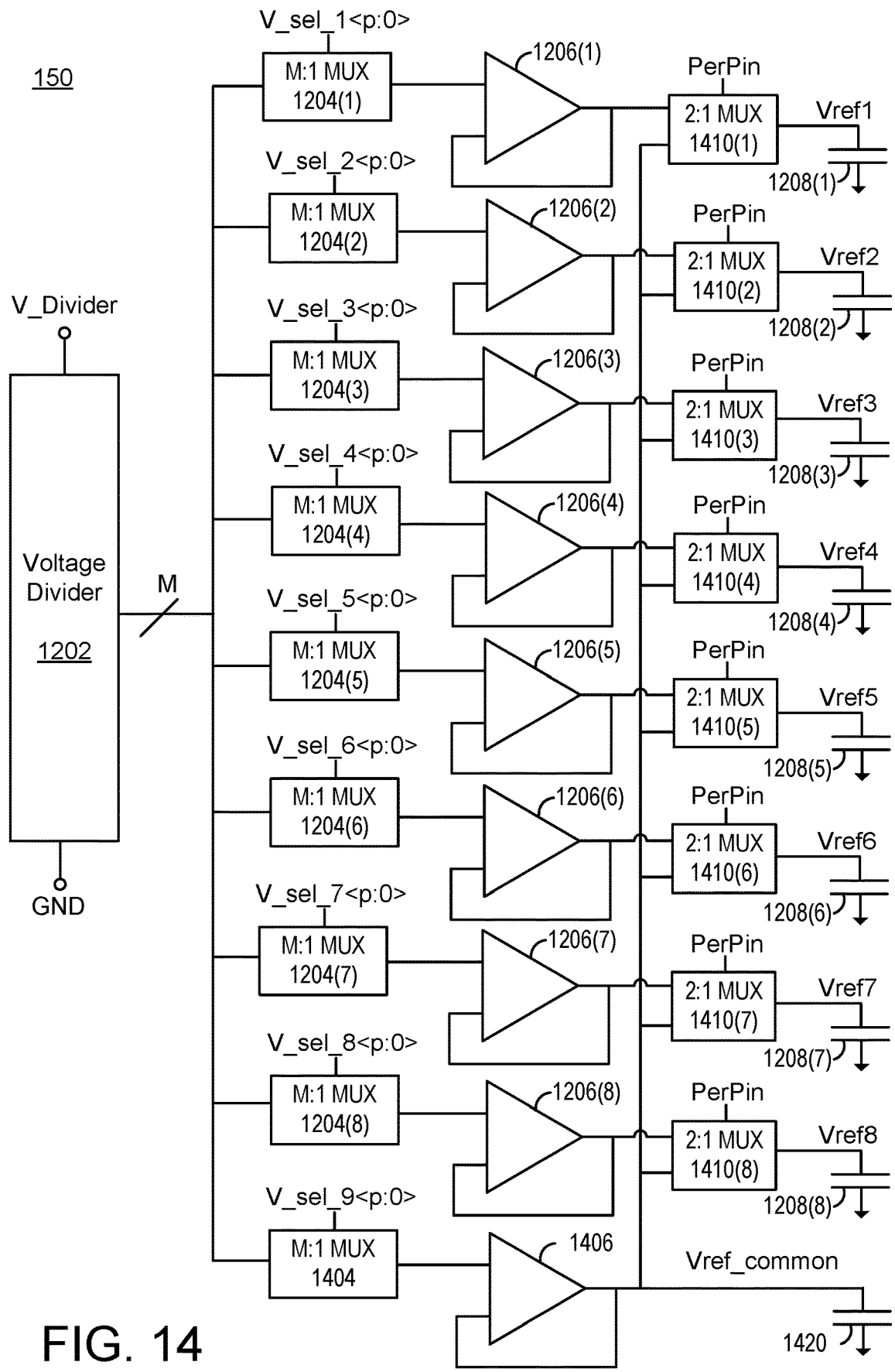
FIG. 14 depicts a block diagram of one embodiment of a Vref generator that can be used to provide a separate Vref to each data receiver or a common Vref to all data receivers.

In some embodiments, the Vref generator 150 is able to provide a separate Vref to each data receiver 304, and is also capable of providing a common Vref to all of the data receivers 304. Therefore, an embodiment of the Vref generator is compatible with technology that uses a common Vref for all data receivers 304. FIG. 14 depicts a block diagram of one embodiment of a Vref generator 150 that can be used to provide a separate Vref to each data receiver 304 or a common Vref to all data receivers 304. In one embodiment, Vref generator 150 is used for the Vref generator 150 in FIG. 10. The Vref generator in FIG. 14 has some elements in common with the Vref generator in FIG. 12; therefore, the same reference numerals are used for similar elements. Specifically, Vref generator 150 in FIG. 14 has voltage divider 1202, MUXes 1204(1)-1204(8), amplifiers 1206(1)-1206(8), and output capacitors 1208(1)-1208(8). Therefore, these common elements will not be described again.

Vref generator 150 of FIG. 14 has an additional MUX 1404, an additional amplifier 1406, and an additional output capacitor 1420. The Vref generator 150 also has a number of switches 1410(1)-1410(8). The additional MUX 1404 has M inputs, which are connected to the respective M outputs of the voltage divider 1202. The additional MUX 1404 has a select input, which is provided with the voltage select signal labeled V_sel_9<p:0>. The operation of the additional MUX 1404 is similar to the operation of the other MUXes 1204 in that the select signal V_sel_9<p:0> is used to select one of the M outputs of the voltage divider 1202. The output of the additional MUX 1404 is connected to an input of the additional amplifier 1406, which in this example is a unity gain amplifier. The additional amplifier 1406 is not required to be a unity gain amplifier. The output of the additional amplifier 1406 is connected to additional output capacitor 1420, which is connected to ground. The voltage at the output of the additional amplifier 1406 is labeled as Vref common, which may be used as a common Vref for all of the data receivers 304.

The switches 1410(1)-1410(8) are used to select between either providing a separate Vref to each data receiver 304, or to provide a common Vref to all data receivers 304. Each switch 1410 inputs a select signal that is referred to as PerPin. The PerPin select signal may be a single bit to select between the two inputs of each switch 1410. The value of PerPin is the same for all of the switches 1410. Hence for one value of PerPin the outputs of amplifiers 1206(1)-1206(8) are selected and passed to the respective output capacitors 1208(1)-1208(8). For the other value of PerPin the outputs the additional amplifier 1406 is selected and passed to the respective output capacitors 1208(1)-1208(8). Therefore, all of the data receivers 304 will receive Vref common in this latter example.

In some embodiments, the additional amplifier 1406 is a larger amplifier than the eight amplifiers 1206(1)-1206(8). Hence, each individual amplifier 1206 may occupy much less area than the additional amplifier 1406. Also, the additional amplifier 1406 may use more power than each individual amplifier 1206. In some embodiments, the additional capacitor 1420 has a higher capacitance than each individual output capacitor 1208. For example, the additional capacitor 1420 could be about 60 pico-farads (pF), whereas each individual output capacitor 1208 might be about 6 pF.

Figure 15:
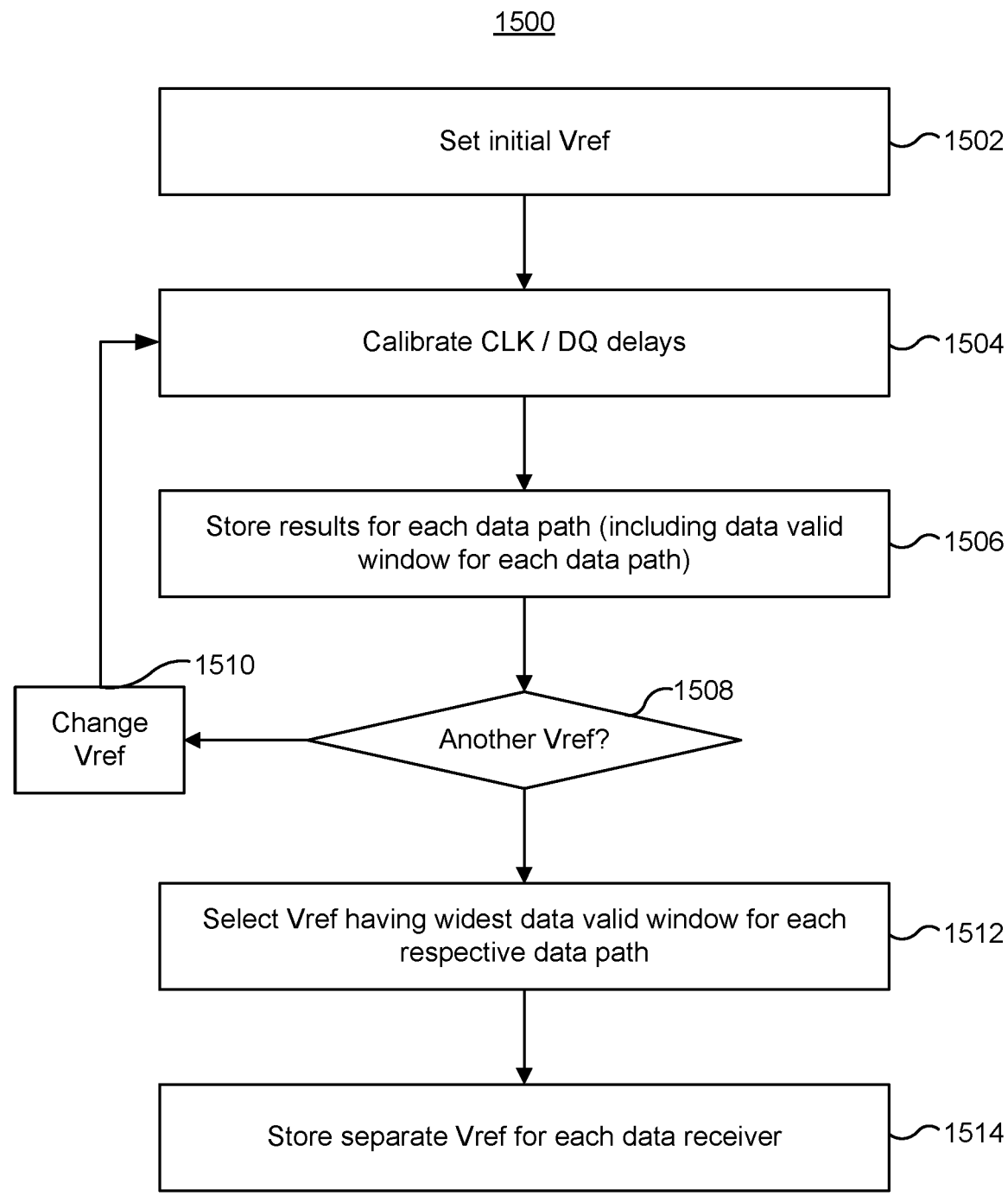
FIG. 15 is a flowchart of one embodiment of a process of calibrating a separate Vref for each data receiver.

In some embodiments, a separate Vref is calibrated for each data receiver 304. FIG. 15 is a flowchart of one embodiment of a process 1500 of calibrating a separate Vref for each data receiver 304. An example will be discussed with reference having eight data receivers 304, but there could be more or fewer data receivers. The process 1500 may be used in what is typically referred to as "write training". Write training may be used to calibrate the delays between the clock (CLK) and the data signals (DQ). In one embodiment, the write training is what may be referred to as transmitter side write training. In one embodiment, the write training is what is referred to as receiver side write training. Further details of transmitter side write training and receiver side write training are described in the Open NAND Flash Interface Specification, Revision 4.2, Feb. 12, 2020. However, process 1500 is not limited to the write training described in the Open NAND Flash Interface Specification.

Step 1502 includes setting an initial value for Vref. A digital code for each data receiver 304 may be provided to the Vref generator 150. The same Vref may be used for all data receivers 304. With reference to FIG. 12, the digital codes may be input to the respective MUXes 1204(1)-1204(8). Hence, step 1502 may select one of the M outputs of the voltage divider 1202. The reference voltages are then provided to the inputs of the data receivers 304. In one embodiment, the state machine 912 provides the digital code.

Step 1504 includes calibrating CLK/DQ delays. Calibrating CLK/DQ delays refers to the process of calibrating the delay between the clock signal (CLK) and each of the data signals (e.g., DQ(1)-DQ(N)). Step 1504 may include comparing data latched by the sampling circuits 310 with expected data. This comparison may be repeated for different delays, which may be referred to as scanning. In an embodiment, step 1504 includes scanning for the widest data valid window. This is done individually for each data path. In one embodiment, the comparisons are performed on the receiving circuit 104 (e.g., memory die 800, control die 908). In one embodiment, the comparisons are performed on the transmitting circuit 102 (e.g., memory controller 602). Hence, step 1504 may include the receiving circuit 104 sending the data that it sampled back to the transmitting circuit 102.

Step 1506 includes storing the results from step 1504. The width of the data valid window may be recorded for each data path. Recall that in the discussion of FIGS. 11A and 11B, it was pointed out that a wider data valid window can be achieved if Vref is properly selected. Hence, the width of the data valid window for the Vref used during this iteration of process 1500 might not be the widest possible data valid window. Therefore, a determination is made in step 1508 whether there are more values for Vref to consider. If so, the value of Vref is changed in step 1510. In one embodiment, state machine 912 provides a new digital code to the Vref generator 150 to change Vref. The process 1500 then repeats steps 1504 and 1506 for this updated Vref. After all values for Vref are tested, the process 1500 moves on to step 1512.

Step 1512 includes a selection of the Vref that has the widest data valid window for each data path. Hence, a separate Vref is selected for each respective data receiver 304. There is some chance that two of the data receivers will have the same magnitude Vref. However, the process 1500 will test each data path separately for the Vref that provides the widest data valid window.

Step 1514 includes storing a separate Vref for each data receiver 304. In one embodiment, the state machine 912 stores a digital code for each Vref in non-volatile memory (e.g., in memory structure 926 and/or in control circuitry 910). The stored values of the respective Vrefs may then be used when receiving data during normal operation.

Figure 16:
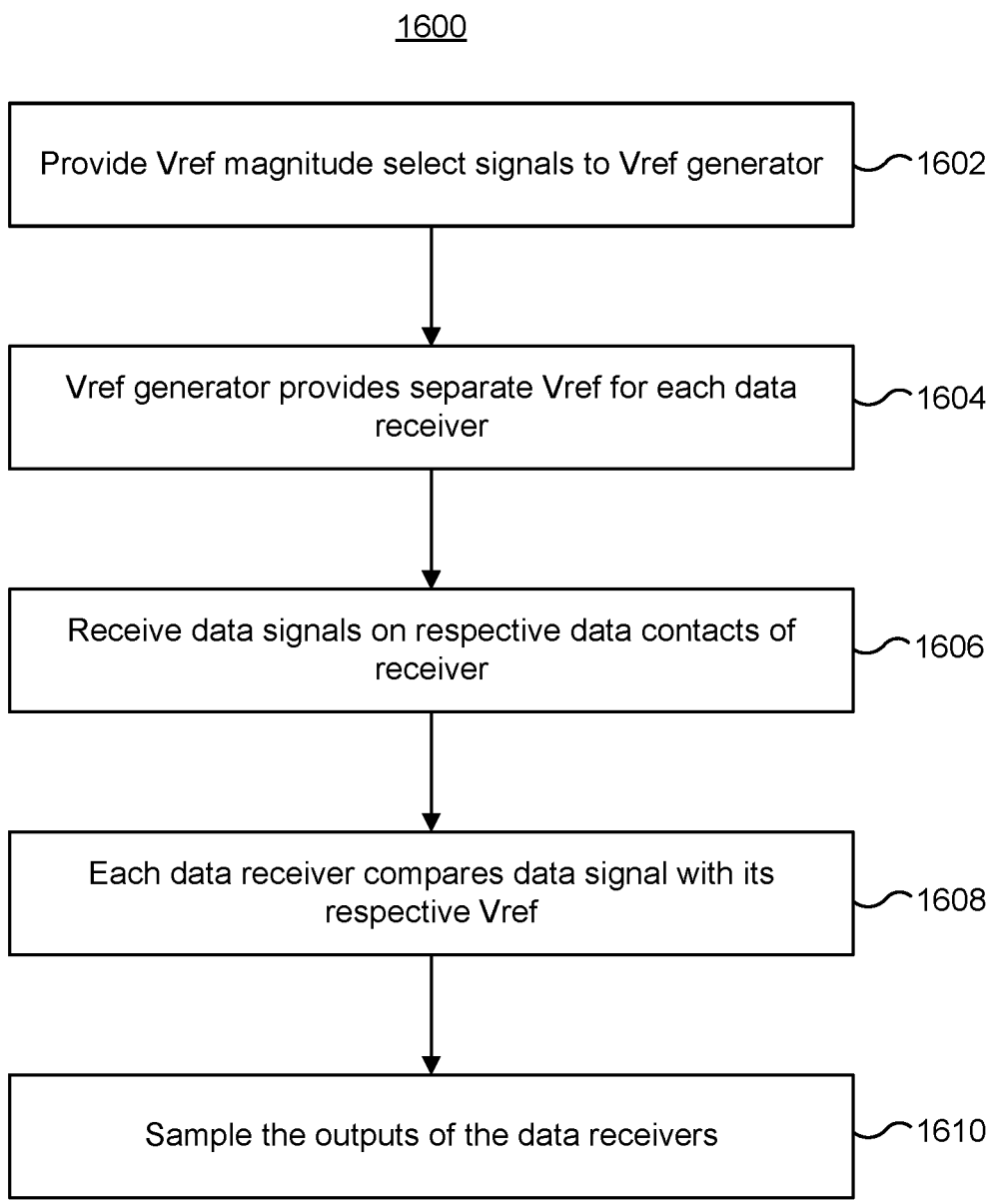
FIG. 16 is a flowchart of one embodiment of a process of operating data receiver in which a separate Vref is provided to each data receiver.

FIG. 16 is a flowchart of one embodiment of a process 1600 of operating data receiver 304 in which a separate Vref is provided to each data receiver 304. Prior to performing process 1600, process 1500 may be used to calibrate a separate Vref for each data receiver 304. An example will be discussed with reference having eight data receivers 304, but there could be more or fewer data receivers. Process 1600 mitigates variations between different data paths by using a separate Vref for each data receiver 304. Moreover, the separate Vrefs are generated on-die by circuitry that occupies a small area, uses low current, and uses low power.

Step 1602 includes providing voltage magnitude select signals to the Vref generator 150. Each voltage magnitude select signal specifies the magnitude of Vref for one of the data receivers 304(1)-304(n). Each voltage magnitude select signal may be a digital code. With reference to FIG. 12, the digital codes may be input to the respective MUXes 1204(1)-1204(8). In one embodiment, state machine 912 provides the digital codes.

Step 1604 includes the Vref generator 150 providing a separate Vref for each data receiver 304. With reference to FIG. 10, Vref generator 150 outputs Vref1-Vrefn, which are provided to the respective data receivers 304(1)-304(n). As described herein, the codes that were provided in step 1602 will select one of the M outputs of the voltage divider 1202 for each MUX 1204. With reference to FIG. 13, in some embodiments, the voltage divider 1202 comprises series connected resistors. There are M voltage outputs from the series connected resistors (labeled V0-Vm−1). Moreover, all of the MUXes 1204 can receive their respective inputs from somewhere along the series connected resistors. Using one common set of series connected resistors to provide the voltages for all of the MUXes 1204 saves area and reduces power/current consumption.

Step 1606 includes receiving data signals on respective data contacts of a receiving circuit. For example, receiving circuit 104 receives a data signal at each of data contacts 112(1)-112(n). The data signals were sent by a transmitting circuit 102 (e.g., memory controller 602).

Step 1608 includes each data receiver 304(1)-304(n) comparing a data signal with its respective Vref. With respect to FIG. 10, data receiver 304(1) compares Vref1 with DQ1, data receiver 304(1) compares Vref2 with DQ2, . . . data receiver 304(n) compares Vrefn with DQn. Each data receiver 304(1)-304(n) also outputs a result of the comparison.

Step 1610 includes sampling the outputs of the respective data receivers 304. With respect to FIG. 10, sampling circuit 310(1) samples the output of data receiver 304(1), sampling circuit 310(2) samples the output of data receiver 304(2), . . . sampling circuit 310(n) samples the output of data receivers 304(n). In one embodiment, the data is then written to non-volatile memory cells in the memory structure 926.

In view of the foregoing, it can be seen that a first embodiment includes, an apparatus comprising a control circuit configured to be connected to non-volatile memory cells, a communication interface comprising a plurality of data contacts, a plurality of data receivers, and a voltage generator. Each data receiver is connected to different one of the data contacts. Each data receiver comprises a first input configured to receive a data signal from one of the data contacts and a second input configured to receive a reference voltage. Each data receiver has an output configured to output a result of a comparison of the data signal with the reference voltage. The voltage generator has a plurality of inputs configured to receive a separate voltage magnitude select signal for each of the plurality of data receivers. The voltage generator has a plurality of outputs each configured to provide a separate reference voltage in accordance with the voltage magnitude select signal for a respective data receiver. Each output of the voltage generator is connected to the second input of one of the data receivers to provide a separate reference voltage to the respective data receiver. The voltage generator resides on the same integrated circuit as the plurality of data receivers.

In a second embodiment and in furtherance to the first embodiment, the control circuit is configured to calibrate the reference voltage separately for each data receiver.

In a third embodiment and in furtherance to the first or second embodiments, the voltage generator comprises a voltage divider configured to receive a voltage. The voltage divider has a plurality of outputs, each voltage divider output configured to provide a different percentage of the voltage.

In a fourth embodiment and in furtherance to any of the third embodiment, the voltage divider comprises a plurality of resistors connected in series. The outputs of the voltage divider are between adjacent resistors of the series connected resistors.

In a fifth embodiment and in furtherance to the third embodiment, the voltage generator further comprises a plurality of multiplexers. There is a separate multiplexer for each data receiver. Each multiplexer has a first plurality of inputs that are connected to different outputs of the voltage divider. Each multiplexer has a second input configured to receive a voltage magnitude select signal for one of the data receivers. Each multiplexer is configured to output a voltage that is a percentage of the voltage in response to the respective voltage magnitude select signal.

In a sixth embodiment and in furtherance to the fifth embodiment, the voltage generator further comprises a plurality of amplifiers. There is a separate amplifier for each data receiver. Each amplifier has a first input connected to the output of one of the multiplexers to receive the output voltage of one of the multiplexers. Each amplifier is connected to the second input of one of the data receivers to provide a reference voltage to the data receiver.

In a seventh embodiment and in furtherance to the sixth embodiment, the voltage generator further comprises a plurality of capacitors, each capacitor connected to the output of one of the amplifiers.

In an eighth embodiment and in furtherance to the sixth embodiment, the apparatus further comprises an additional multiplexer having a first plurality of inputs that are connected to the different outputs of the voltage divider. The additional multiplexer has a select input configured to receive a voltage magnitude select signal. The additional multiplexer is configured to output a voltage that is a percentage of the voltage in response to the voltage magnitude select signal. The apparatus further comprises an additional amplifier having a first input connected to the output the additional multiplexer to receive the output voltage of the additional multiplexer. The apparatus further comprises a plurality of switches, each switch having a first input connected to the output of one of the plurality of amplifiers and a second input connected to the output of the additional amplifier. Each switch has a select input configured to receive a select signal. Each switch has an output connected to the second input of one of the data receivers. Each switch is configured to output its respective first input or second input in response to the select signal.

In a ninth embodiment and in furtherance to any of the first to eighth embodiments, the apparatus further comprises further comprises a plurality of on-die termination circuits, each on-die termination circuit connected to the first input of one of the data receivers.

In a tenth embodiment and in furtherance to any of the first to ninth embodiments, the non-volatile memory cells reside on a first semiconductor die. The control circuit, the plurality of data receivers, and the voltage generator reside on a second semiconductor die.

In an eleventh embodiment and in furtherance to any of the first to tenth embodiments, the non-volatile memory cells, the control circuit, the plurality of data receivers, and the voltage generator reside on the same semiconductor die.

One embodiment includes a method comprising a method of operating non-volatile memory. The method comprises providing a plurality of voltage magnitude select signals to a voltage generator on a semiconductor die. The method comprises generating, by the voltage generator, a separate reference voltage for each of a plurality of data receivers on the semiconductor die in accordance with the respective voltage magnitude select signals. The method comprises providing one of the reference voltages to each of the data receivers. The method comprises receiving a plurality of data signals at data contacts on the semiconductor die. The method comprises comparing, by each of the plurality of data receivers, one of the data signals to the reference voltage for the respective data receiver. The method comprises outputting, by each of the plurality of data receivers, results of the comparisons of the respective data receiver.

One embodiment includes a non-volatile memory system, comprising a memory structure comprising non-volatile memory cells, a communication interface having a plurality of data input/output (I/O) contacts, and a plurality of on-die termination circuits. Each on-die termination circuit is connected to one of the data I/O contacts. The non-volatile memory system further comprises a plurality of data receivers. Each data receiver has a first input connected to one of the data I/O contacts, a second input, and an output. Each data receiver is configured to compare a data signal at the first input with a reference voltage at the second input and provide a result of the comparison at the output. The non-volatile memory system further comprises a voltage generator having a plurality of inputs configured to receive a separate voltage magnitude select signal for each of the plurality of data receivers. The voltage generator has a corresponding plurality of outputs configured to provide a plurality of separate reference voltages in accordance with the voltage magnitude select signals. Each output of the voltage generator is connected to the second input of one of the data receivers to provide a separate reference voltage to the respective data receiver. The non-volatile memory system further comprises a control circuit that calibrates a separate reference voltage for each data receiver during a write training process, and provides the separate voltage magnitude select signals for each respective data receiver to the voltage generator to provide a separate calibrated reference voltage to each data receiver.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
a control circuit configured to be connected to non-volatile memory cells;
a communication interface comprising a plurality of data contacts;
a plurality of data receivers, wherein each data receiver is connected to a different one of the data contacts, each data receiver comprising a first input configured to receive a data signal from one of the data contacts and a second input configured to receive a reference voltage, each data receiver having an output configured to output a result of a comparison of the data signal with the reference voltage; and a voltage generator having a plurality of inputs configured to receive a separate voltage magnitude select signal for each of the plurality of data receivers, the voltage generator having a plurality of outputs each configured to provide a separate reference voltage in accordance with the voltage magnitude select signal for a respective data receiver, each output of the voltage generator connected to the second input of one of the data receivers to provide a separate reference voltage to the respective data receiver, wherein the voltage generator resides on the same integrated circuit as the plurality of data receivers.

2. The apparatus of claim 1, further wherein the control circuit is configured to:
calibrate the reference voltage separately for each data receiver.

3. The apparatus of claim 1, wherein the voltage generator comprises:
a voltage divider configured to receive a voltage, the voltage divider having a plurality of outputs, each voltage divider output configured to provide a different percentage of the voltage.

4. The apparatus of claim 3, wherein the voltage divider comprises:
a plurality of resistors connected in series, wherein the outputs of the voltage divider are between adjacent resistors of the series connected resistors.

5. The apparatus of claim 3, wherein the voltage generator further comprises:
a plurality of multiplexers, wherein there is a separate multiplexer for each data receiver, each multiplexer having a first plurality of inputs that are connected to different outputs of the voltage divider, each multiplexer having a second input configured to receive a voltage magnitude select signal for one of the data receivers, each multiplexer configured to output a voltage that is a percentage of the voltage in response to the respective voltage magnitude select signal.

6. The apparatus of claim 5, wherein the voltage generator further comprises:
a plurality of amplifiers, wherein there is a separate amplifier for each data receiver, each amplifier having a first input connected to the output of one of the multiplexers to receive the output voltage of one of the multiplexers, each amplifier connected to the second input of one of the data receivers to provide a reference voltage to the data receiver.

7. The apparatus of claim 6, wherein the voltage generator further comprises:
a plurality of capacitors, each capacitor connected to the output of one of the amplifiers.

8. The apparatus of claim 6, further comprising:
an additional multiplexer having a first plurality of inputs that are connected to the different outputs of the voltage divider, the additional multiplexer having a select input configured to receive a voltage magnitude select signal, the additional multiplexer configured to output a voltage that is a percentage of the voltage in response to the voltage magnitude select signal;
an additional amplifier having a first input connected to the output the additional multiplexer to receive the output voltage of the additional multiplexer; and
a plurality of switches, each switch having a first input connected to the output of one of the plurality of amplifiers and a second input connected to the output of the additional amplifier, each switch having a select input configured to receive a select signal, each switch having an output connected to the second input of one of the data receivers, each switch configured to output its respective first input or second input in response to the select signal.

9. The apparatus of claim 1, further comprising a plurality of on-die termination circuits, each on-die termination circuit connected to the first input of one of the data receivers.

10. The apparatus of claim 1, wherein:
the non-volatile memory cells reside on a first semiconductor die; and
the control circuit, the plurality of data receivers, and the voltage generator reside on a second semiconductor die.

11. The apparatus of claim 1, wherein:
the non-volatile memory cells, the control circuit, the plurality of data receivers, and the voltage generator reside on the same semiconductor die.

12. A method of operating non-volatile memory, the method comprising:
providing a plurality of voltage magnitude select signals to a voltage generator on a semiconductor die;
generating, by the voltage generator, a separate reference voltage for each of a plurality of data receivers on the semiconductor die in accordance with the respective voltage magnitude select signals;
providing one of the reference voltages to each of the data receivers;
receiving a plurality of data signals at data contacts on the semiconductor die;
comparing, by each of the plurality of data receivers, one of the data signals to the reference voltage for the respective data receiver; and
outputting, by each of the plurality of data receivers, results of the comparisons of the respective data receiver.

13. The method of claim 12, further comprising:
calibrating a separate reference voltage for each of the plurality of data receivers; and
using the calibrated reference voltage at the data receivers when receiving the plurality of data signals.

14. The method of claim 12, wherein generating, by the voltage generator, a separate reference voltage for each of the plurality of data receivers on the semiconductor die in accordance with the respective voltage magnitude select signals comprises:
providing a voltage to a voltage divider on the semiconductor die; and
selecting the reference voltage for each respective data receiver from the voltage divider.

15. The method of claim 14, wherein generating, by the voltage generator, a separate reference voltage for each of the plurality of data receivers on the semiconductor die in accordance with the respective voltage magnitude select signals comprises:
providing a voltage to a series connected resistors on the semiconductor die; and
selecting the reference voltage for each respective data receiver from nodes that are between adjacent series connected resistors.

16. A non-volatile memory system, comprising:
a memory structure comprising non-volatile memory cells;
a communication interface having a plurality of data input/output (I/O) contacts;

a plurality of on-die termination circuits, each on-die termination circuit connected to one of the data I/O contacts;

a plurality of data receivers, each data receiver having a first input connected to one of the data I/O contacts, a second input, and an output, each data receiver configured to compare a data signal at the first input with a reference voltage at the second input and provide a result of the comparison at the output;

a voltage generator having a plurality of inputs configured to receive a separate voltage magnitude select signal for each of the plurality of data receivers, the voltage generator having a corresponding plurality of outputs configured to provide a plurality of separate reference voltages in accordance with the voltage magnitude select signals, each output of the voltage generator connected to the second input of one of the data receivers to provide a separate reference voltage to the respective data receiver; and a control circuit that:
  calibrates a separate reference voltage for each data receiver during a write training process; and
  provides the separate voltage magnitude select signals for each respective data receiver to the voltage generator to provide a separate calibrated reference voltage to each data receiver.

17. The non-volatile memory system of claim 16, wherein the voltage generator comprises:

a voltage divider configured to receive a voltage, the voltage divider having a plurality of outputs, each voltage divider output configured to provide a different percentage of the voltage.

18. The non-volatile memory system of claim 17, wherein the voltage divider comprises:

a plurality of resistors connected in series, wherein the outputs of the voltage divider are between adjacent resistors of the series connected resistors.

19. The non-volatile memory system of claim 17, wherein the voltage generator further comprises:

a plurality of multiplexers, wherein there is a separate multiplexer for each data receiver, each multiplexer having a first plurality of inputs that are connected to different outputs of the voltage divider, each multiplexer having a second input configured to receive a voltage magnitude select signal for one of the data receivers, each multiplexer configured to output a voltage that is a percentage of the voltage in response to the respective voltage magnitude select signal.

20. The non-volatile memory system of claim 19, wherein the voltage generator further comprises:

a plurality of amplifiers, wherein there is a separate amplifier for each data receiver, each amplifier having a first input connected to the output of one of the multiplexers to receive the output voltage of one of the multiplexers, each amplifier connected to the second input of one of the data receivers to provide a reference voltage to the data receiver.

* * * * *